US010840087B2

(12) United States Patent
Weimer et al.

(10) Patent No.: US 10,840,087 B2
(45) Date of Patent: Nov. 17, 2020

(54) REMOTE PLASMA BASED DEPOSITION OF BORON NITRIDE, BORON CARBIDE, AND BORON CARBONITRIDE FILMS

(71) Applicant: Lam Research Corporation, Fremont, CA (US)

(72) Inventors: Matthew Scott Weimer, Chicago, IL (US); Bhadri N. Varadarajan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/041,153

(22) Filed: Jul. 20, 2018

(65) Prior Publication Data
US 2020/0027725 A1 Jan. 23, 2020

(51) Int. Cl.
*H01L 21/02* (2006.01)
*C23C 16/32* (2006.01)
(Continued)

(52) U.S. Cl.
CPC ...... *H01L 21/02274* (2013.01); *C23C 16/325* (2013.01); *C23C 16/342* (2013.01);
(Continued)

(58) Field of Classification Search
CPC .......... H01L 21/02274; H01L 16/325; H01L 31/342; H01L 37/32357; H01L 37/32449; H01L 21/02205
See application file for complete search history.

(56) References Cited

U.S. PATENT DOCUMENTS 4,952,658 A 8/1990 Kalchauer et al.
5,122,431 A 6/1992 Kodama et al.
(Continued)

FOREIGN PATENT DOCUMENTS

CN 1714168 A 12/2005
CN 1735945 A 2/2006
(Continued)

OTHER PUBLICATIONS

U.S. Office Action dated Jan. 28, 2019 issued in U.S. Appl. No. 15/969,045.
(Continued)

*Primary Examiner* — Zandra V Smith
*Assistant Examiner* — Andre C Stevenson
(74) *Attorney, Agent, or Firm* — Weaver Austin Villeneuve & Sampson LLP

(57) ABSTRACT

A boron nitride, boron carbide, or boron carbonitride film can be deposited using a remote plasma chemical vapor deposition (CVD) technique. A boron-containing precursor is provided to a reaction chamber, where the boron-containing precursors has at least one boron atom bonded to a hydrogen atom. Radical species, such as hydrogen radical species, are provided from a remote plasma source and into the reaction chamber at a substantially low energy state or ground state. A hydrocarbon precursor may be flowed along with the boron-containing precursor, and a nitrogen-containing plasma species may be introduced along with the radical species from the remote plasma source and into the reaction chamber. The boron-containing precursor may interact with the radical species along with one or both of the hydrocarbon precursor and the nitrogen-containing precursor to deposit the boron nitride, boron carbide, or boron carbonitride film.

19 Claims, 9 Drawing Sheets

(51) Int. Cl.
*H01J 37/32* (2006.01)
*C23C 16/34* (2006.01)
(52) U.S. Cl.
CPC .. *H01J 37/32357* (2013.01); *H01J 37/32449* (2013.01); *H01L 21/02205* (2013.01)

(56) References Cited

U.S. PATENT DOCUMENTS

| | | |
|---|---|---|
| 5,447,816 A | 9/1995 | Kodama et al. |
| 5,518,572 A | 5/1996 | Kinoshita et al. |
| 5,567,243 A | 10/1996 | Foster et al. |
| 5,807,615 A | 9/1998 | Sindzingre et al. |
| 6,262,445 B1 | 7/2001 | Swanson et al. |
| 6,365,527 B1 | 4/2002 | Yang et al. |
| 6,383,299 B1 | 5/2002 | Yuda et al. |
| 6,395,150 B1 | 5/2002 | Van Cleemput et al. |
| 6,448,186 B1 | 9/2002 | Olson et al. |
| 6,576,345 B1 | 6/2003 | Van Cleemput et al. |
| 6,624,064 B1 | 9/2003 | Sahin et al. |
| 6,790,788 B2 | 9/2004 | Li et al. |
| 6,846,391 B1 | 1/2005 | Papasouliotis et al. |
| 6,849,561 B1 | 2/2005 | Goundar |
| 6,851,384 B2 | 2/2005 | Yuda et al. |
| 6,890,850 B2 | 5/2005 | Lee et al. |
| 6,919,270 B2 | 7/2005 | Satoh et al. |
| 6,935,553 B2 | 8/2005 | Suga et al. |
| 6,949,450 B2 | 9/2005 | Chiang et al. |
| 6,991,959 B2 | 1/2006 | Goundar et al. |
| 7,163,896 B1 | 1/2007 | Zhu et al. |
| 7,256,139 B2 | 8/2007 | Moghadam et al. |
| 7,524,735 B1 | 4/2009 | Gauri et al. |
| 7,622,400 B1 | 11/2009 | Fox et al. |
| 7,662,355 B2 | 2/2010 | Kamisako et al. |
| 7,709,063 B2 | 5/2010 | Yuda et al. |
| 7,736,728 B2 | 6/2010 | Loboda et al. |
| 8,021,992 B2 | 9/2011 | Liou et al. |
| 8,053,372 B1 | 11/2011 | Greer et al. |
| 8,084,339 B2 | 12/2011 | Antonelli et al. |
| 8,168,268 B2 | 5/2012 | Ovshinsky |
| 8,178,168 B2 | 5/2012 | O'Neill et al. |
| 8,217,513 B2 | 7/2012 | Antonelli et al. |
| 8,864,935 B2 | 10/2014 | Fair et al. |
| 8,916,022 B1 | 12/2014 | Caron |
| 8,927,442 B1 | 1/2015 | Angyal et al. |
| 9,234,276 B2 | 1/2016 | Varadarajan et al. |
| 9,371,579 B2 | 6/2016 | Varadarajan et al. |
| 9,391,086 B2 | 7/2016 | Soda et al. |
| 9,591,738 B2 | 3/2017 | Qiu et al. |
| 9,837,270 B1 | 12/2017 | Varadarajan et al. |
| 10,002,787 B2 | 6/2018 | Yu et al. |
| 10,211,310 B2 | 2/2019 | Varadarajan et al. |
| 10,297,442 B2 | 5/2019 | Varadarajan et al. |
| 10,325,773 B2 | 6/2019 | Varadarajan et al. |
| 10,472,714 B2 | 11/2019 | Varadarajan |
| 10,580,690 B2 | 3/2020 | Yu et al. |
| 2002/0000202 A1 | 1/2002 | Yuda et al. |
| 2002/0039625 A1 | 4/2002 | Powell et al. |
| 2002/0106891 A1 | 8/2002 | Kim et al. |
| 2002/0132101 A1 | 9/2002 | Fonash et al. |
| 2003/0008528 A1 | 1/2003 | Xia et al. |
| 2003/0064154 A1 | 4/2003 | Laxman et al. |
| 2003/0139035 A1 | 7/2003 | Yim et al. |
| 2003/0154141 A1 | 8/2003 | Capazario et al. |
| 2003/0176030 A1 | 9/2003 | Tsuji et al. |
| 2003/0194496 A1 | 10/2003 | Xu et al. |
| 2004/0067308 A1 | 4/2004 | Zheng et al. |
| 2004/0084680 A1 | 5/2004 | Ruelke et al. |
| 2004/0089924 A1 | 5/2004 | Yuasa et al. |
| 2004/0115876 A1 | 6/2004 | Goundar et al. |
| 2004/0115954 A1 | 6/2004 | Todd |
| 2004/0121085 A1 | 6/2004 | Wang et al. |
| 2004/0161535 A1 | 8/2004 | Goundar et al. |
| 2004/0194706 A1 | 10/2004 | Wang et al. |
| 2004/0232552 A1 | 11/2004 | Wang et al. |
| 2004/0253777 A1 | 12/2004 | Miyoshi et al. |
| 2005/0100682 A1 | 5/2005 | Fukiage et al. |
| 2005/0230831 A1 | 10/2005 | Clevenger et al. |
| 2005/0255714 A1 | 11/2005 | Iyer et al. |
| 2005/0287790 A1 | 12/2005 | Owada et al. |
| 2005/0287811 A1 | 12/2005 | Inukai |
| 2006/0014384 A1 | 1/2006 | Lee et al. |
| 2006/0014399 A1 | 1/2006 | Joe |
| 2006/0046520 A1 | 3/2006 | Padhi et al. |
| 2006/0091559 A1 | 5/2006 | Nguyen et al. |
| 2006/0160376 A1 | 7/2006 | Padhi et al. |
| 2006/0216916 A1 | 9/2006 | Tsai et al. |
| 2006/0252273 A1 | 11/2006 | Lakshmanan et al. |
| 2006/0273319 A1* | 12/2006 | Dairiki ............... H01L 27/1214 257/66 |
| 2007/0004204 A1 | 1/2007 | Fukazawa et al. |
| 2007/0141812 A1 | 6/2007 | Zagwijn et al. |
| 2007/0173071 A1 | 7/2007 | Afzali-Ardakani et al. |
| 2007/0190266 A1 | 8/2007 | Fu |
| 2007/0281496 A1 | 12/2007 | Ingle et al. |
| 2008/0064173 A1 | 3/2008 | Hung |
| 2008/0156264 A1 | 7/2008 | Fair et al. |
| 2008/0178805 A1 | 7/2008 | Paterson et al. |
| 2008/0217746 A1 | 9/2008 | Morita et al. |
| 2008/0233366 A1 | 9/2008 | Edelstein et al. |
| 2008/0277765 A1 | 11/2008 | Lane et al. |
| 2009/0017227 A1 | 1/2009 | Fu et al. |
| 2009/0017640 A1* | 1/2009 | Huh ............... C23C 16/28 438/783 |
| 2009/0042402 A1 | 2/2009 | Morioka |
| 2009/0082240 A1 | 3/2009 | Nukui et al. |
| 2009/0218699 A1 | 9/2009 | Torres et al. |
| 2009/0258487 A1 | 10/2009 | Lin et al. |
| 2009/0264277 A1 | 10/2009 | Raj et al. |
| 2009/0325364 A1 | 12/2009 | Sasagawa et al. |
| 2010/0075077 A1 | 3/2010 | Bicker et al. |
| 2010/0081293 A1 | 4/2010 | Mallick et al. |
| 2010/0181654 A1* | 7/2010 | Fujiwara ............... C23C 16/342 257/632 |
| 2010/0207274 A1 | 8/2010 | Hayashi et al. |
| 2010/0255667 A1 | 10/2010 | Seino et al. |
| 2010/0308463 A1 | 12/2010 | Yu et al. |
| 2010/0317198 A1 | 12/2010 | Antonelli et al. |
| 2011/0027957 A1 | 2/2011 | Berry |
| 2011/0045676 A1 | 2/2011 | Park et al. |
| 2011/0074044 A1 | 3/2011 | Lin et al. |
| 2011/0111533 A1 | 5/2011 | Varadarajan et al. |
| 2011/0114994 A1 | 5/2011 | Mandlik et al. |
| 2011/0117678 A1 | 5/2011 | Varadarajan et al. |
| 2011/0146568 A1 | 6/2011 | Haukka et al. |
| 2011/0180866 A1 | 7/2011 | Matsuda et al. |
| 2011/0193230 A1 | 8/2011 | Nogami et al. |
| 2011/0204492 A1 | 8/2011 | Xie et al. |
| 2011/0236594 A1 | 9/2011 | Haverkamp et al. |
| 2012/0009802 A1 | 1/2012 | Lavoie et al. |
| 2012/0077349 A1 | 3/2012 | Li et al. |
| 2012/0122302 A1 | 5/2012 | Weidman et al. |
| 2012/0142172 A1 | 6/2012 | Fox et al. |
| 2012/0329287 A1 | 12/2012 | Gates et al. |
| 2013/0008378 A1* | 1/2013 | Antonelli ............... C23C 16/342 118/697 |
| 2013/0043514 A1 | 2/2013 | Grill et al. |
| 2013/0056818 A1 | 3/2013 | Iino et al. |
| 2013/0075455 A1 | 3/2013 | Shimizu |
| 2013/0084711 A1 | 4/2013 | Liang et al. |
| 2013/0119406 A1 | 5/2013 | Notsu et al. |
| 2013/0129940 A1 | 5/2013 | Xiao et al. |
| 2013/0242493 A1 | 9/2013 | Shenoy et al. |
| 2013/0298942 A1 | 11/2013 | Ren et al. |
| 2013/0319290 A1 | 12/2013 | Xiao et al. |
| 2013/0330932 A1 | 12/2013 | Rangarajan et al. |
| 2013/0330935 A1 | 12/2013 | Varadarajan |
| 2014/0132466 A1 | 5/2014 | Inoue et al. |
| 2014/0191365 A1 | 7/2014 | Barabash et al. |
| 2014/0197470 A1 | 7/2014 | Lee et al. |
| 2014/0264780 A1 | 9/2014 | Yim et al. |
| 2014/0264925 A1 | 9/2014 | Chen |
| 2014/0302690 A1 | 10/2014 | Underwood et al. |
| 2014/0356549 A1 | 12/2014 | Varadarajan |
| 2015/0016085 A1 | 1/2015 | Natsumeda et al. |

(56) References Cited

U.S. PATENT DOCUMENTS

| | | | |
|---|---|---|---|
| 2015/0118394 A1 | 4/2015 | Varadarajan et al. | |
| 2015/0179466 A1 | 6/2015 | Takayama et al. | |
| 2015/0214015 A1 | 7/2015 | Kikuchi et al. | |
| 2015/0303056 A1 | 10/2015 | Varadarajan et al. | |
| 2016/0020089 A1 | 1/2016 | Thadani et al. | |
| 2016/0090649 A1 | 3/2016 | Varadarajan | |
| 2016/0268286 A1 | 9/2016 | Tamura | |
| 2016/0276140 A1 | 9/2016 | Varadarajan et al. | |
| 2016/0284615 A1 | 9/2016 | Kitajima et al. | |
| 2016/0314964 A1 | 10/2016 | Tang et al. | |
| 2016/0358804 A1 | 12/2016 | Kulshreshtha et al. | |
| 2017/0140924 A1 | 5/2017 | Suzuki et al. | |
| 2017/0365462 A1 | 12/2017 | Varadarajan et al. | |
| 2018/0033614 A1 | 2/2018 | Chandra et al. | |
| 2018/0096842 A1 | 4/2018 | Varadarajan | |
| 2018/0144977 A1 | 5/2018 | Yu et al. | |
| 2018/0202042 A1 | 7/2018 | Fafard et al. | |
| 2018/0240664 A9 | 8/2018 | Varadarajan et al. | |
| 2018/0330939 A1* | 11/2018 | Pore | H01L 21/0217 |
| 2018/0330945 A1 | 11/2018 | Varadarajan et al. | |
| 2018/0330985 A1 | 11/2018 | Yu et al. | |
| 2018/0347035 A1 | 12/2018 | Weimer et al. | |
| 2019/0181004 A1 | 6/2019 | Tang et al. | |
| 2019/0259604 A1 | 8/2019 | Varadarajan et al. | |
| 2019/0382885 A1 | 12/2019 | Varadarajan | |

FOREIGN PATENT DOCUMENTS

| | | |
|---|---|---|
| CN | 101017834 A | 8/2007 |
| CN | 101065834 A | 10/2007 |
| CN | 102171796 A | 8/2011 |
| CN | 102187450 A | 9/2011 |
| CN | 102468434 A | 5/2012 |
| CN | 102652353 A | 8/2012 |
| CN | 102892922 A | 1/2013 |
| JP | 2005-051096 A | 2/2005 |
| KR | 10-1334640 B1 | 11/2013 |
| TW | 261689 B | 11/1995 |
| TW | 476807 B | 2/2002 |
| TW | 200600984 | 1/2006 |
| TW | 200903635 A | 1/2009 |
| TW | 201124553 A | 7/2011 |
| TW | 201214563 A | 4/2012 |
| TW | 201405659 A | 2/2014 |
| WO | WO 2011/109148 A2 | 9/2011 |

OTHER PUBLICATIONS

U.S. Final Office Action dated Aug. 6, 2019 issued in U.S. Appl. No. 15/969,045.
U.S. Office Action dated Feb. 7, 2014 issued in U.S. Appl. No. 13/494,836.
U.S. Final Office Action dated Aug. 21, 2014 issued in U.S. Appl. No. 13/494,836.
U.S. Office Action dated May 5, 2015 issued in U.S. Appl. No. 13/494,836.
U.S. Final Office Action dated Nov. 16, 2015 issued in U.S. Appl. No. 13/494,836.
U.S. Office Action dated Mar. 10, 2016 issued in U.S. Appl. No. 13/494,836.
U.S. Final Office Action dated Jul. 11, 2016 issued in U.S. Appl. No. 13/494,836.
U.S. Office Action dated Jan. 9, 2017 issued in U.S. Appl. No. 13/494,836.
U.S. Examiner's Answer to the Appeal brief [filed Apr. 28, 2017] before the Patent Trial and Appeal Board dated Sep. 25, 2017 issued in U.S. Appl. No. 13/494,836.
U.S. Notice of Allowance dated Oct. 2, 2018 issued in U.S. Appl. No. 13/494,836.
U.S. Office Action dated Dec. 19, 2014 issued in U.S. Appl. No. 13/907,699.
U.S. Final Office Action dated May 14, 2015 issued in U.S. Appl. No. 13/907,699.
U.S. Advisory Action and Examiner Initiated Interview Summary dated Aug. 12, 2015 issued in U.S. Appl. No. 13/907,699.
U.S. Notice of Allowance dated Sep. 10, 2015 issued in U.S. Appl. No. 13/907,699.
U.S. Office Action dated Feb. 5, 2018 issued in U.S. Appl. No. 14/961,637.
U.S. Final Office Action dated Aug. 28, 2018 issued in U.S. Appl. No. 14/961,637.
U.S. Office Action dated Jan. 29, 2019 issued in U.S. Appl. No. 14/961,637.
U.S. Notice of Allowance dated Jun. 18, 2019 issued in U.S. Appl. No. 14/961,637.
U.S. Office Action dated Sep. 15, 2015 issued in U.S. Appl. No. 14/062,648.
U.S. Notice of Allowance dated Feb. 19, 2016 issued in U.S. Appl. No. 14/062,648.
U.S. Office Action dated Nov. 16, 2018 issued in U.S. Appl. No. 15/169,530.
U.S. Final Office Aciton dated Mar. 5, 2019 issued in U.S. Appl. No. 15/169,530.
U.S. Office Action dated Nov. 2, 2015 issued in U.S. Appl. No. 14/616,435.
U.S. Final Office Action dated Mar. 10, 2016 issued in U.S. Appl. No. 14/616,435.
U.S. Office Action dated Jul. 8, 2016 issued in U.S. Appl. No. 14/616,435.
U.S. Final Office Action dated Feb. 22, 2017 issued in U.S. Appl. No. 14/616,435.
U.S. Examiner's Answer to the Appeal brief [filed May 19, 2017] before the Patent Trial and Appeal Board dated Sep. 22, 2017 issued in U.S. Appl. No. 14/616,435.
U.S. Notice of Allowance dated Feb. 4, 2019 issued in U.S. Appl. No. 14/616,435.
U.S. Final Office Action, dated May 19, 2017, issued in U.S. Appl. No. 14/692,627.
U.S. Office Action dated Sep. 12, 2016 issued in U.S. Appl. No. 14/692,627.
U.S. Office Action dated Nov. 8, 2017 issued in U.S. Appl. No. 14/692,627.
U.S. Final Office Action dated May 16, 2018 issued in U.S. Appl. No. 14/692,627.
U.S. Office Action dated Dec. 29, 2017 issued in U.S. Appl. No. 15/283,159.
U.S. Office Action dated Aug. 29, 2018 issued in U.S. Appl. No. 15/283,159.
U.S. Notice of Allowance dated Jan. 7, 2019 issued in U.S. Appl. No. 15/283,159.
U.S. Notice of Allowance dated Feb. 7, 2018 issued in U.S. Appl. No. 15/408,291.
U.S. Office Action dated Jul. 28, 2017 issued in U.S. Appl. No. 15/408,291.
U.S. Office Action dated Apr. 18, 2019 issued in U.S. Appl. No. 15/972,554.
U.S. Office Action dated Jul. 7, 2017 issued in U.S. Appl. No. 15/382,137.
U.S. Notice of Allowance dated Sep. 22, 2017 issued in U.S. Appl. No. 15/382,137.
Taiwan Office Action dated Dec. 22, 2015 issued in Application No. TW 102120742.
Korean First Office Action dated Aug. 9, 2019 issued in Application No. KR 10-2013-0066728.
Taiwan Office Action dated Nov. 6, 2017 issued in Application No. TW 103119100.
Taiwan Notice of Allowance dated Jan. 8, 2019 issued in Application No. TW 107126975.
Singapore Notice of Allowance & Supplemental Exam Report dated Nov. 30, 2017 issued in Application No. SG 10201402381U.
Chinese First Office Action dated Sep. 5, 2016 issued in Application No. CN 201410576747.1.
Chinese First Office Action dated Dec. 20, 2018 issued in Application No. CN 201710307116.3.

(56) References Cited

OTHER PUBLICATIONS

Chinese Second Office Action dated Jun. 3, 2019 issued in Application No. CN 201710307116.3.
Taiwan Notice of Allowance and Search Report dated Jun. 14, 2018 issued in Application No. TW 103136697.
Chinese First Office Action dated Jan. 3, 2018 issued in Application No. CN 201610084166.5.
Chinese Second Office Action dated Oct. 12, 2018 issued in Application No. CN 201610084166.5.
Chinese Third Office Action dated Apr. 22, 2019 issued in Application No. CN 201610084166.5.
Chinese First Office Action dated Jun. 25, 2018 issued in Application No. CN 201610251266.2.
Chinese Second Office Action [Decision of Final Rejection] dated Jan. 25, 2019 issued in Application No. CN 201610251266.2.
PCT International Search Report and Written Opinion (ISA/KR) dated Mar. 15, 2018 issued in PCT/US2017/062882.
PCT International Preliminary Report on Patentability (ISA/KR) dated Jun. 6, 2019 issued in PCT/US2017/062882.
PCT International Search Report and Written Opinion (ISA/KR) dated Mar. 19, 2018 issued in PCT/US2017/064024.
PCT International Preliminary Report on Patentability (ISA/KR) dated Jun. 27, 2019 issued in PCT/US2017/064024.
PCT International Search Report and Written Opinion (ISA/KR) dated Dec. 26, 2017 issued in PCT/US2017/051794.
PCT International Preliminary Report on Patentability dated Apr. 11, 2019 (ISA/KR) dated Apr. 11, 2019 issued in PCT/US2017/051794.
Taiwanese First Office Action dated Dec. 24, 2018 issued in Application No. TW 107123391.
Taiwanese Second Office Action dated Apr. 18, 2019 issued in Application No. TW 107123391.
Taiwanes Third Office Action dated Aug. 21, 2019 issued in Application No. TW 107123391.
Taiwanese First Office Action dated Jul. 31, 2019 issued in Application No. TW 105103396.
Blaszczyk-Lezak et al., (2005) "Silicon Carbonitride Films Produced by Remote Hydrogen Microwave Plasma CVD Using a (Dimethylamino)dimethylsilane Precursor," Chemical Vapor Deposition, 11(1):44-52.
G.E. Coates et al., "Chapter Four: Organometallic compounds of elements of main groups IV and V," Principles of Organometallic Chemistry, (1968) pp. 121-122.
"Development of Current Atomic Theory," Emission Spectrum of Hydrogen, [downloaded at http://chemed.chem.purdue.edu/genchem/topicreview/bp/ch6/bohr.html on Sep. 23, 2015], 7pp.
"Dummies' Guide to Hydrogen," Molecular Hydrogen Foundation, MHF, [downloaded at http://www.molecularhydrogenfoundation.org/core-information/dummies-guide-to-hydrogen on Sep. 23, 2015], 2 pp.
Fozza et al., (Jan./Feb. 1998) "Vacuum ultraviolet to visible emission of some pure gases and their mixtures used for plasma processing," J. Vac. Sci. Technol. A, American Vacuum Society, 16(1):72-77.
Fozza et al., (Jul. 2000) "Vacuum ultraviolet to visible emission from hydrogen plasma: Effect of excitation frequency," Journal of Applied Physics, 88(1):20-33.
Grubbs et al. (May/Jun. 2006) "Attenuation of hydrogen radicals traveling under flowing gas conditions through tubes of different materials," J. Vac. Sci. Technol. A, 24(3):486-496.
Hatanaka et al., (2000) "Experiments and analyses of SiC thin film deposition from organo-silicon by a remote plasma method," Thin Solid Films, 368:287-291.
Holländer et al., (May 1994) "Vacuum ultraviolet emission from microwave plasmas of hydrogen and its mixtures with helium and oxygen," J. Vac. Sci. Technol. A, 12(3):879-882.
Huran, J., et al., (2004) "RBS study of amorphous silicon carbide films deposited by PECVD," Czechoslovak Journal of Physics, 54(Suppl. C):C1006-C1010.
Jones et al., (Nov. 30, 2001) "Silicon Containing Polymers: The Science and Technology of Their Synthesis and Applications," Springer, p. 705.
"Radical (chemistry)" From Wikipedia, the free encyclopedia, [downloaded at http://en.wikipedia.org/wiki/Radical_(chemistry) on Sep. 23, 2015), 11 pages.
Wróbel et al. (2001) "Oligomerization and Polymerization Steps in Remote Plasma Chemical Vapor Deposition of Silicon-Carbon and Silica Films from Organosilicon Sources," Chem. Mater, 13(5):1884-1895.
Wróbel et al., (2010) "Reactivity of Organosilicon Precursors in Remote Hydrogen Microwave Plasma Chemical Vapor Deposition of Silicon Carbide and Silicon Carbonitride Thin-Film Coatings," Appl. Organometal. Chem., 24:201-207.
Xu, Ying-Yu, et al., (1999) "Preparation of SiC Thin Film Using Organosilicon by Remote Plasma CVD Method," Mat. Res. Soc. Symp. Proc., 544:185-189.
U.S. Appl. No. 16/041,153, filed Jul. 20, 2018, Weimer et al.
U.S. Appl. No. 16/240,133, filed Jan. 4, 2019, Varadarajan.
U.S. Appl. No. 16/556,145, filed Aug. 29, 2019, Varadarajan.
U.S. Office Action dated Mar. 6, 2020 issued in U.S. Appl. No. 15/696,045.
U.S. Office Action dated Dec. 2, 2019 issued in U.S. Appl. No. 15/169,530.
U.S. Final Office Action dated Apr. 10, 2020 issued in U.S. Appl. No. 15/169,530.
U.S. Office Action dated Mar. 19, 2020 issued in U.S. Appl. No. 16/194,102.
U.S. Notice of Allowance dated Oct. 22, 2019 issued in U.S. Appl. No. 15/972,554.
Korean Decision for Grant of Patent dated Dec. 27, 2019 issued in Application No. KR 10-2013-0066728.
Chinese Third Office Action dated Dec. 9, 2019 issued in Application No. CN 201710307116.3.
International Search Report and Written Opinion dated Nov. 8, 2019 (ISA/KR) issued in PCT/US2019/042821.
International Search Report and Written Opinion dated Nov. 20, 2019 (ISA/KR) issued in PCT/US2019/042812.
International Search Report and Written Opinion dated Oct. 25, 2019 issued in Application No. PCT/US2019/042413.
Benilan et al., (Oct. 4, 2011) "Optimization of microwave Hydrogen plasma discharges to mimic Lyman $\alpha$(121.6 nm) solar irradiations," EPSC-DPS2011-1317, EPSC-DPJ Joint Meeting 2011, EPSC Abstracts, 6:2pp.
Boo et al., (1999) "Growth of boron nitride thin films on silicon substrates using new organoboron precursors" Phys. Stat. sol. (a), vol. 176. Nov. 1999, pp. 705-710.
Sota et al., (2010) "Influence of atomic bonds on electrical property of boron carbon nitride films synthesized by remote plasma-assisted chemical vapor deposition. Diamond & Related Materials" vol. 19, No. 12, Jun. 23, 2010, pp. 1441-1445.

\* cited by examiner

REMOTE PLASMA BASED DEPOSITION OF BORON NITRIDE, BORON CARBIDE, AND BORON CARBONITRIDE FILMS

BACKGROUND

The silicon carbide (SiC) class of thin films possesses physical, chemical, electrical, and mechanical properties that can be used in a variety of applications, particularly integrated circuit applications. The boron nitride ($B_xN_y$), boron carbide ($B_xC_y$), and boron carbonitride ($B_xC_yN_z$) class of thin films possesses unique physical, chemical, electrical, and mechanical properties that can serve as in a variety of applications, including integrated circuit applications, and even as an alternative to SiC thin films in some cases.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of depositing a boron-containing film on a substrate. The method includes providing a substrate in a reaction chamber, flowing a boron-containing precursor into the reaction chamber towards the substrate, and flowing a carbon-containing precursor into the reaction chamber along with the boron-containing precursor. The boron-containing precursor has one or more B—H bonds. The method further includes generating, from a hydrogen source gas, radicals of hydrogen in a remote plasma source that are generated upstream of the boron-containing precursor and the carbon-containing precursor, and introducing the radicals of hydrogen into the reaction chamber and towards the substrate, where the radicals of hydrogen are in a ground state to react with the boron-containing precursor and the carbon-containing precursor to form a boron-containing film on the substrate.

In some implementations, all or substantially all of the radicals of hydrogen in an environment adjacent to the substrate are radicals of hydrogen in the ground state. In some implementations, the boron-containing precursor includes a borane. The boron-containing precursor can include diborane, triborane, tetraborane, pentaborane, hexaborane, or decaborane. In some implementations, the carbon-containing precursor is a hydrocarbon molecule with at least a carbon-to-carbon double bond or triple bond. The carbon-containing precursor can include propylene, ethylene, butene, pentene, butadiene, pentadiene, hexadiene, heptadiene, toluene, benzene, acetylene, propyne, butyne, pentyne, or hexyne. In some implementations, the boron-containing film has no C—C bonds or substantially no C—C bonds. In some implementations, the method further includes providing a nitrogen-containing reactant along with the hydrogen source gas in the remote plasma source, where radicals of the nitrogen-containing reactant are generated in the remote plasma source, and introducing the radicals of the nitrogen-containing reactant along with the radicals of hydrogen into the reaction chamber and towards the substrate, where the radicals of the nitrogen-containing reactant and hydrogen react with the boron-containing precursor and the carbon-containing precursor to form a boron carbonitride (BCN) film. In some implementations, the boron-containing film has a conformality of at least 95%. In some implementations, the boron-containing film has a Young's modulus equal to or greater than about 130 GPa. In some implementations, the boron-containing precursor has one or more B—C and/or B—N bonds. In some implementations, an atomic concentration of boron in the boron-containing film is between about 30% and about 75% and an atomic concentration of carbon in the boron-containing film is between about 15% and about 45%.

Another aspect involves a method of depositing a boron-containing film on a substrate. The method includes providing a substrate in a reaction chamber, flowing a boron-containing precursor into the reaction chamber towards the substrate, generating, from a source gas including a hydrogen gas and a nitrogen-containing reactant, radicals of hydrogen and the nitrogen-containing reactant in a remote plasma source that are generated upstream of the boron-containing precursor, and introducing the radicals of hydrogen and the nitrogen-containing reactant into the reaction chamber and towards the substrate. The radicals of hydrogen are in a ground state to react with the boron-containing precursor to form a boron-containing film on the substrate. The boron-containing precursor has one or more B—H bonds.

In some implementations, the method further includes flowing a carbon-containing precursor into the reaction chamber along with the boron-containing precursor, where the radicals of hydrogen in the ground state react with the boron-containing precursor and the carbon-containing precursor to form the boron-containing film.

These and other aspects are described further below with reference to the drawings.

DETAILED DESCRIPTION

Figure 1A:
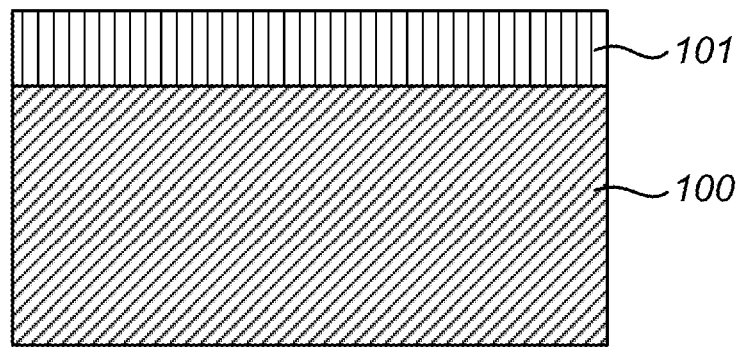
FIG. 1A illustrates a cross-sectional schematic of an example boron nitride, boron carbide, or boron carbonitride film deposited over a substrate.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Manufacture of semiconductor devices typically involves depositing one or more thin films on a substrate in an integrated fabrication process. For example, the silicon carbide class of thin films may be desirable in semiconductor device fabrication because it has a low dielectric constant. The silicon carbide class of thin films may also be desirable because of its adhesion to other films, electromigration performance with copper, barrier properties, etch selectivity, low current leakage, high breakdown voltage, conformality, high chemical stability, and high thermal stability, among other properties. However, the performance of silicon carbide films may not meet future requirements or demands of the microelectronics industry.

Boron-containing films including boron nitride (BN), boron carbide (BC), and boron carbonitride (BCN) films may have properties different from or not present in undoped or doped silicon carbide films. For example, boron nitride, boron carbide, and boron carbonitride thin films may be desirable in semiconductor device fabrication because of their low dielectric constant, adhesion to other films, electromigration performance with copper, barrier properties, etch selectivity, low current leakage, high breakdown voltage, conformality, high chemical stability, and high thermal stability, among other properties. As discussed in more detail below, such boron-containing films may be deposited with unique physical, chemical, electrical, and mechanical properties that may be advantageous over silicon carbide films. As used herein, boron-containing films may refer to films of boron nitride, boron carbide, or boron carbonitride.

In some aspects of a fabrication process, boron-containing films can typically be deposited using physical vapor deposition (PVD), chemical vapor deposition (CVD), or plasma-enhanced chemical vapor deposition (PECVD) processes. Precursor molecules for depositing the boron-containing films include boron-containing molecules such as boranes, higher order boranes, boron halides, aminoboranes, borazines, alkyl-substituted borazines, and the like. The precursor molecules may react with a carbon-containing reactant and/or a nitrogen-containing reactant. Depositing high-quality boron-containing films can have many challenges, such as providing films with excellent step coverage and low dielectric constant.

Current PECVD processes may use in situ plasma processing in which plasma is provided directly adjacent to a substrate. While this disclosure is not limited by any particular theory, it is believed that the plasma conditions in typical PECVD processes cause boron-containing precursor molecules to form reactive precursor fragments with high sticking coefficients. High sticking coefficients of the precursor molecules and their fragments can deposit boron-containing films with poor step coverage, as reactive precursor fragments may disproportionately stick to the upper regions of sidewalls and other structures in recessed features.

In addition, direct plasma from current PECVD processes will grow carbon. Specifically, direct plasma conditions will produce energetic species that result in C—C, N—N, and/or C—N bonding, in addition to B—C and B—N bonds, in the boron-containing film. This produces an alloy of boron carbide and/or boron nitride with carbon and/or carbonitride. Such a film has poorer mechanical properties and a higher etch rate, which may result from the segregation of carbon from boron carbide and/or boron nitride.

Direct plasma conditions sometimes employed in PECVD can lead to directionality in the deposition because the energy to break up the precursor molecules can be a low frequency which creates a lot of ion bombardment at the surface. The directional deposition can also lead to deposition of boron-containing films with poor step coverage and low in-feature sidewall film density. A direct plasma is a plasma in which the plasma (electrons and positive ions at an appropriate concentration) reside in close proximity to the substrate surface during deposition, sometimes separated from the substrate surface by only a plasma sheath.

Not only can PECVD conditions result in boron-containing films with poor step coverage and low in-feature sidewall film density, but PECVD conditions may result in boron-containing films with reduced film quality and detrimentally high dielectric constants. Direct plasma conditions may lead to increased boron-hydrogen bonding (B—H) in deposited boron-containing films. Direct plasma conditions may lead to increased carbon-carbon bonding (C—C), nitrogen-nitrogen bonding (N—N), and/or carbon-nitrogen bonding (C—N). The presence of such bonds can produce films with low step coverage, poor mechanical properties, and poor electrical properties, including films with detrimentally high dielectric constants.

Environment at the Substrate Surface During Deposition

FIG. 1A illustrates a cross-sectional schematic of an example boron nitride, boron carbide, or boron carbonitride film deposited over a substrate. A boron-containing film 101 in FIG. 1A can be a boron nitride, boron carbide, or boron carbonitride film. The boron-containing film 101 can be formed under process conditions producing a relatively mild environment adjacent to the substrate 100. The substrate 100 can be any wafer, semiconductor wafer, partially fabricated integrated circuit, printed circuit board, display screen, or other appropriate work piece. The process for depositing the boron-containing film 101 can involve one or more boron-containing precursors each having one or more B—H bonds. At least one of the boron atoms is bonded to a hydrogen atom. In some implementations, each of the boron-containing precursors can have one or more B—B bonds. In some implementations, each of the boron-containing precursors has no B—C bonds or B—N bonds. The chemical structures of example boron-containing precursors are discussed in further detail below.

The boron-containing precursor includes one or more B—H bonds and optionally one or more B—B bonds. However, it will be understood that additional boron-containing precursors (e.g., boron trichloride) may not necessarily include B—H bonds or B—B bonds. These additional boron-containing precursors may be provided concurrently with the boron-containing precursor having one or more B—H bonds. During the deposition process, the B—H bonds are selectively broken and serve as active sites for cross-linking or forming bonds with other reactants. In other words, the reaction conditions adjacent to the substrate 100 provide for the selective breaking of B—H bonds so that hydrogen is extracted from the broken B—H bonds.

Generally, the described reaction conditions exist at the exposed face of the substrate 100 (the face where the boron-containing film 101 is deposited). They may further exist at some distance above the substrate 100, e.g., about 0.5 micrometers to about 150 millimeters above the substrate 100. In effect, activation of the precursor can happen in the gas phase at a substantial distance above the substrate 100. Typically, the pertinent reaction conditions will be uniform or substantially uniform over the entire exposed face of the substrate 100, although certain applications may permit some variation.

In addition to boron-containing precursors, the environment adjacent the work piece (e.g., substrate 100) includes one or more radical species, preferably in a substantially low energy state. An example of such species includes hydrogen radicals (i.e., hydrogen atom radicals). In some embodiments, all, or substantially all, or a substantial fraction of the hydrogen atom radicals can be in the ground state, e.g., at least about 90% or 95% of the hydrogen atom radicals adjacent the work piece are in the ground state. In certain embodiments, a source gas is introduced into the remote plasma source, where the source gas can be a hydrogen source gas. In some embodiments, the source gas is provided in a carrier gas such as helium. As an example, hydrogen gas ($H_2$) may be provided in a helium carrier at a concentration of about 1-10% hydrogen. Pressure, fraction of carrier gas such as helium, and other process conditions are chosen so that the hydrogen atoms encounter the substrate 100 as radicals in a low energy state without recombining.

As explained elsewhere, hydrogen gas may be supplied into a remote plasma source to generate the hydrogen atom radicals. The remote plasma source may be positioned upstream from the substrate 100 and the environment adjacent to the substrate 100. Once generated, the hydrogen atom radicals may be in an excited energy state. For example, hydrogen in an excited energy state can have an energy of at least 10.2 eV (first excited state). In some implementations, when the excited hydrogen atom radicals lose their energy, or relax, the excited hydrogen atom radical may become a substantially low energy state hydrogen atom radical or a ground state hydrogen atom radical. In some implementations, the deposition conditions may be designed so that the excited hydrogen atom radicals lose energy or relax to form substantially low energy state or ground state hydrogen atom radicals. For example, the remote plasma source or associated components may be designed so that a residence time of hydrogen atom radicals diffusing from the remote plasma source to the substrate 100 is greater than the energetic relaxation time of an excited hydrogen atom radical. The energetic relaxation time for an excited hydrogen atom radical can be about equal to or less than about $1 \times 10^{-3}$ seconds.

A state in which a substantial fraction of hydrogen atom radicals are in the ground state can be achieved by various techniques. Some apparatuses, such as described below, are designed to achieve this state. Apparatus features and process control features can be tested and tuned to produce a mild state in which a substantial fraction of the hydrogen atom radicals are in the ground state. For example, an apparatus may be operated and tested for charged particles downstream of the plasma source; i.e., near the substrate 100. The process and apparatus may be tuned until substantially no charged species exist near the substrate 100. Additionally, apparatus and process features may be tuned to a configuration where they begin to produce a boron-containing film 101 from a boron-containing precursor. The relatively mild conditions that support such film deposition are chosen.

In addition to boron-containing precursors, the environment adjacent to the work piece (e.g., substrate 100) can include one or more nitrogen-containing radical species (i.e., nitrogen-containing plasma species). The nitrogen-containing radical species may incorporate nitrogen in the boron-containing film 101 to form a boron nitride film or boron carbonitride film. In some implementations, the nitrogen-containing radical species may include elemental nitrogen radicals (atomic or diatomic) and/or N—H containing radicals such as ammonia radicals. Examples of N—H containing radicals include but are not limited to radicals of methylamine, dimethylamine, and aniline.

The nitrogen-containing radical species and the hydrogen radical species may be generated by a remote plasma source. The remote plasma source may be positioned upstream from the substrate 100 and the environment adjacent to the substrate 100. Accordingly, the nitrogen-containing radical species may be introduced to a reaction chamber and towards the substrate 100 along the same flow path as the hydrogen radical species. A source gas can be introduced into the remote plasma source, where the source gas can include hydrogen gas, nitrogen gas, N—H containing species, or mixtures thereof. The aforementioned radical species may be generated from the source gas. The hydrogen gas is at least partially converted to ions and/or radicals of hydrogen in the remote plasma source. A nitrogen-containing reactant such as nitrogen gas ($N_2$) or ammonia ($NH_3$) is provided to the remote plasma source, where the nitrogen-containing reactant is at least partially converted to ions and/or radicals of the nitrogen-containing reactant in the remote plasma source. This generates the nitrogen-containing radicals in the remote plasma source. Nitrogen-containing radical species and hydrogen radical species both react with the boron-containing precursor(s) to produce the deposited boron-containing film 101.

In addition to boron-containing precursors, the environment adjacent to the work piece (e.g., substrate 100) can include one or more carbon-containing precursors. The carbon-containing precursors may incorporate carbon in the boron-containing film 101 to form a boron carbide film or boron carbonitride film. Each of the carbon-containing precursors may be a hydrocarbon molecule with one or more carbon-to-carbon double bonds or triple bonds. The carbon-containing precursors are flowed along with the boron-containing precursors into the reaction chamber towards the substrate 100.

The carbon-containing precursors are introduced into the reaction chamber downstream from the remote plasma source. Put another way, the hydrogen radical species and/or nitrogen-containing radical species are generated upstream from the carbon-containing precursors and the boron-containing precursors. The carbon-containing precursors may be introduced to the reaction chamber via the same flow path as the boron-containing precursors. This means that the carbon-containing precursors and the boron-containing precursors may be introduced via a gas outlet or showerhead without direct exposure to plasma.

In addition to boron-containing precursors, the environment adjacent to the work piece (e.g., substrate 100) can include an inert carrier gas or diluent gas. Examples of an inert carrier gas or diluent gas include but are not limited to helium (He), neon (Ne), argon (Ar), krypton (Kr), xenon (Xe), and nitrogen ($N_2$). Upstream from the deposition reaction surface, the boron-containing precursors can be mixed with the inert carrier gas. In some implementations, the hydrogen gas is provided with an inert carrier gas of helium. The inert carrier gas can be provided with a mass greater than the hydrogen gas. In some implementations, a gas mixture of helium, hydrogen, and nitrogen is provided in the remote plasma source.

The temperature in the environment adjacent to the substrate 100 can be any suitable temperature facilitating the deposition reaction, but sometimes limited by the application of the device containing the boron-containing film 101. In some embodiments, the temperature in the environment adjacent to the substrate 100 can be largely controlled by the temperature of a pedestal on which a substrate 100 is supported during deposition of the boron-containing film 101. In some embodiments, the operating temperature can be between about 50° C. and about 500° C. For example, the operating temperature can be between about 250° C. and about 400° C. in many integrated circuit applications. In some embodiments, increasing the temperature can lead to increased cross-linking on the substrate surface.

The pressure in the environment adjacent to the substrate 100 can be any suitable pressure to produce reactive radicals in a reaction chamber. In some embodiments, the pressure can be about 35 Torr or lower. For example, the pressure can be between about 10 Torr and about 20 Torr, such as in embodiments implementing a microwave generated plasma. In other examples, the pressure can be less than about 5 Torr, or between about 0.2 Torr and about 5 Torr, such as in embodiments implementing a radio-frequency (RF) generated plasma.

The environment adjacent to the substrate 100 provides for deposition of the boron-containing film 101 on the substrate 100 by remote plasma CVD. A boron-containing precursor molecule may be flowed into a reaction chamber towards the substrate 100. A source gas is supplied to a remote plasma source upstream from the reaction chamber, and power is provided to the remote plasma source that may cause the source gas to dissociate and generate ions and radicals in an excited energy state. After excitation, the radicals in the excited energy state relax to substantially low energy state radicals or ground state radicals, such as ground state hydrogen radicals. In some embodiments, the source gas may include a nitrogen-containing reactant so that excited nitrogen-containing plasma species may be generated in the remote plasma source. The radical species of the source gas may react with bonds in the boron-containing precursor molecule, where the boron-containing precursor molecule has at least one B—H bond. The reaction may occur at the environment adjacent to the substrate 100 to cause deposition of the boron-containing film 101, which may be a boron nitride or boron carbonitride film. In some embodiments, a carbon-containing precursor molecule may be flowed into the reaction chamber along with the boron-containing precursor molecule. The radical species of the source gas may react with bonds in the carbon-containing precursor molecule and the boron-containing precursor molecule. The reaction may occur at the environment adjacent to the substrate 100 to cause deposition of the boron-containing film 101, which may be a boron carbide or boron carbonitride film.

In some embodiments, substantially all or a substantial fraction of atoms of the deposited film are provided by the precursor molecules, including the boron-containing precursor molecules and carbon-containing precursor molecules, and the nitrogen-containing reactant. In such cases, the low energy radicals including the ground state hydrogen radicals used to drive the deposition reaction do not substantially contribute to the mass of the deposited layer. In some embodiments, some radicals of higher energy state or even ions can potentially be present near the wafer plane.

In some embodiments, the process conditions employ radical species in a substantially low energy state sufficient to activate carbon-containing precursor molecules and boron-containing precursor molecules. Such process conditions may not have substantial amounts of ions, electrons, or radical species in high energy states such as states above the ground state. In some embodiments, the concentration of ions in the region adjacent the film is no greater than about $10^7/cm^3$. The presence of substantial amounts of ions or high energy radicals may tend to produce films with undesirable electrical properties (e.g., high dielectric constants and/or low breakdown voltages), mechanical properties (e.g., low Young's modulus and/or high intrinsic stress), and poor conformality.

Figure 2:
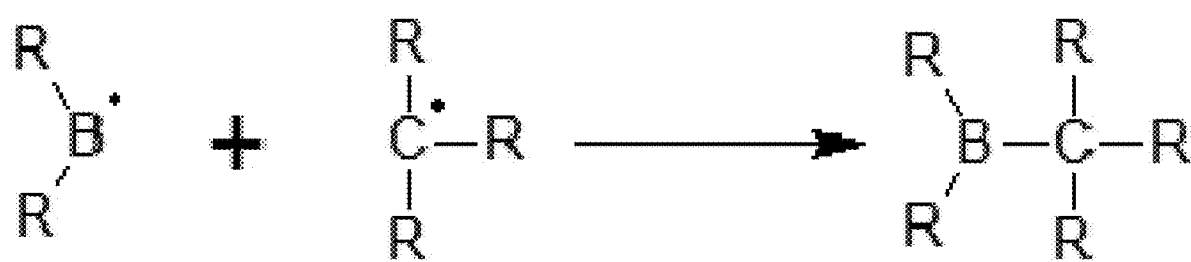
FIG. 2 shows an example of a chemical reaction between an activated hydrocarbon molecule from a carbon-containing precursor and an activated boron-containing precursor.

FIG. 2 shows an example of a chemical reaction between an activated hydrocarbon molecule from a carbon-containing precursor and an activated boron-containing precursor. Without being limited by any theory, the hydrogen radicals in the substantially low energy state or ground state may interact with alkyne or alkene groups in the hydrocarbon molecule that results in the formation of activated hydrocarbon molecules. In addition, the hydrogen radicals in the substantially low energy state or ground state may interact with the B—H bond(s) in the boron-containing precursor that results in the formation of activated boron-containing precursors. The hydrogen radicals activate the double or triple bonds in the hydrocarbon molecule in a process called "saturation" to generate a carbon-based radical species. Furthermore, the hydrogen radicals may react with the B—H bond(s) in the boron-containing precursor to break the B—H bond(s) and form a boron-based radical species and hydrogen ($H_2$) byproduct. In some instances, the boron-based radical species can react with the double or triple bond in the hydrocarbon molecule to form B—C bonds and deposit a boron-containing film. In some instances, the carbon-based radical species reacts with a weak B—H bond in the boron-containing precursor to form a B—C bond and a hydrogen (H●) radical, where the reaction results in the deposition of a boron-containing film.

In addition or in the alternative to the carbon-containing precursor, nitrogen-based plasma species from the nitrogen-containing reactant may participate in a deposition reaction to incorporate nitrogen in the boron-containing film. Examples of nitrogen-based plasma species may include N—H containing radicals or nitrogen radicals. The nitrogen-based plasma species may break B—H bond(s) to form B—N bond(s) and deposit a boron nitride or boron carbonitride film.

In some embodiments, only the radical species, the boron-containing precursors, and the carbon-containing precursors contribute to the composition of the deposited boron-containing film. In other embodiments, the deposition reaction includes a co-reactant other than the aforementioned precursors and the radical species, which may or may not contribute to the composition of the boron-containing film. Examples of such co-reactants include carbon dioxide ($CO_2$), carbon monoxide (CO), water ($H_2O$), methanol ($CH_3OH$), oxygen ($O_2$), ozone ($O_3$), nitrous oxide ($N_2O$), and combinations thereof. Such materials may be used as nitriding agents, oxidizers, reductants, etc. In some cases, they can be used to tune an amount of carbon in the deposited film. In some cases, they can be used to tune an amount of nitrogen or oxygen in the deposited film. In some implementations, the co-reactant may be introduced along with the boron-containing precursor; e.g., without direct exposure to plasma. In some implementations, the co-reactant may be introduced along with the hydrogen radical species; e.g., with exposure to plasma in a remote plasma source.

Figure 1B:
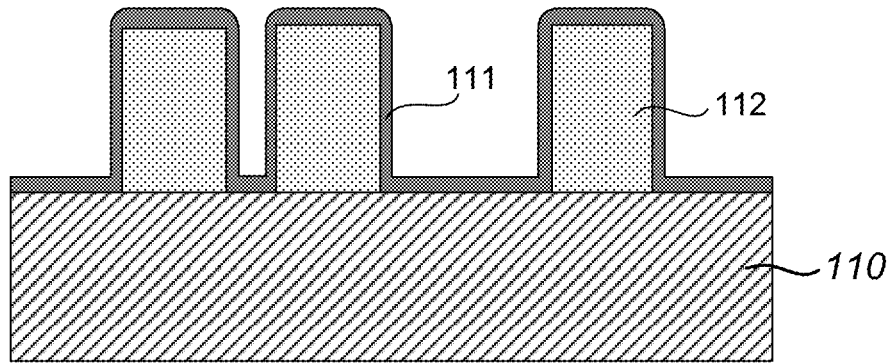
FIG. 1B illustrates a cross-sectional schematic of an example boron nitride, boron carbide, or boron carbonitride film conformally deposited on features of a substrate.
Figure 1C:
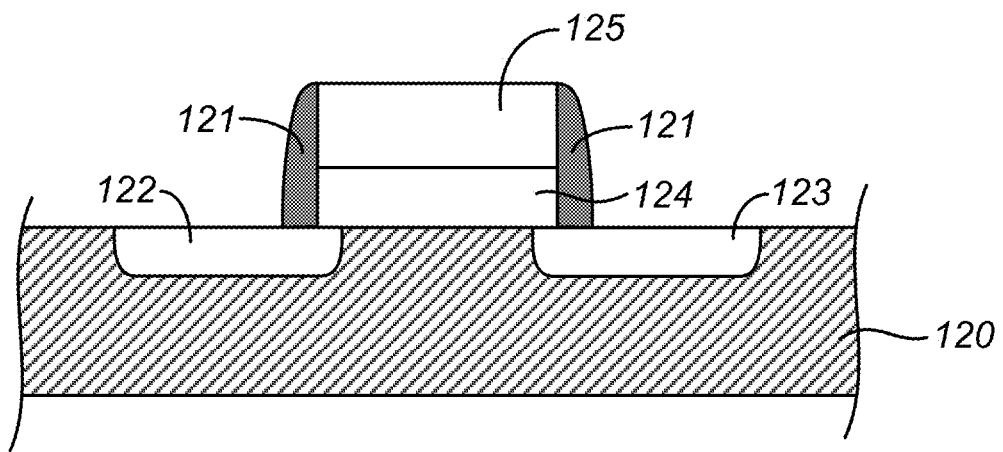
FIG. 1C illustrates a cross-sectional schematic of example boron nitride, boron carbide, or boron carbonitride vertical structures on sidewalls of a gate electrode of a transistor.
Figure 1D:
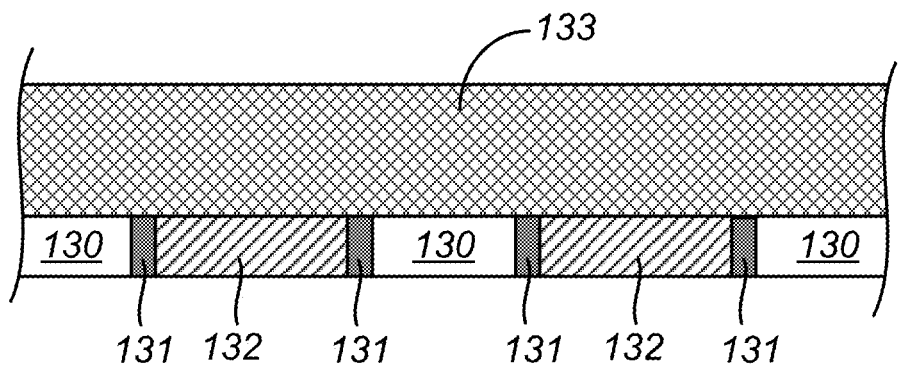
FIG. 1D illustrates a cross-sectional schematic of example boron nitride, boron carbide, or boron carbonitride vertical structures on exposed sidewalls of copper lines in an air gap type metallization layer.
Figure 1E:
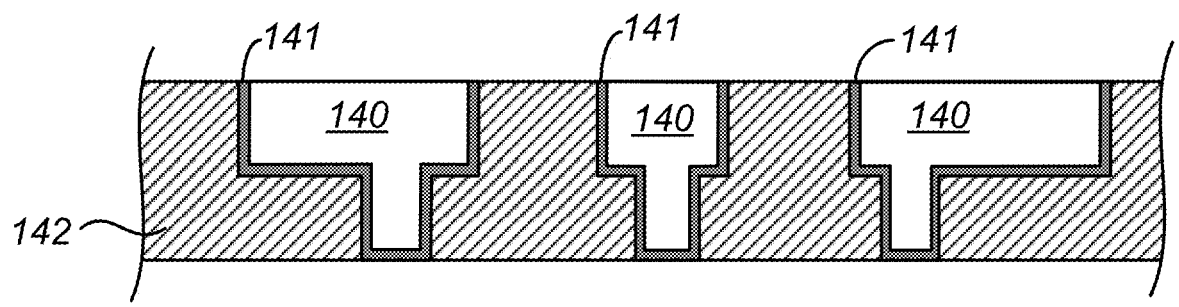
FIG. 1E illustrates a cross-sectional schematic of example boron nitride, boron carbide, or boron carbonitride pore sealants for porous dielectric materials.

Boron-containing films may be used in semiconductor devices. For example, boron nitride, boron carbide, or boron carbonitride films may be employed as metal diffusion barriers, etch stop layers, hard mask layers, gate spacers for source and drain implants, encapsulation barriers for magnetoresistive random-access memory (MRAM) or resistive random-access memory (RRAM), and hermetic diffusion barriers at air gaps, among other applications. FIGS. 1B-1E illustrate cross-sections of structures containing boron-containing films in a variety of applications. FIG. 1B illustrates a cross-sectional schematic of an example boron nitride, boron carbide, or boron carbonitride film conformally deposited on features of a substrate. FIG. 1C illustrates a cross-sectional schematic of example boron nitride, boron carbide, or boron carbonitride vertical structures on sidewalls of a gate electrode of a transistor. FIG. 1D illustrates a cross-sectional schematic of example boron nitride, boron carbide, or boron carbonitride vertical structures on exposed sidewalls of copper lines in an air gap type metallization layer. FIG. 1E illustrates a cross-sectional schematic of example boron nitride, boron carbide, or boron carbonitride pore sealants for porous dielectric materials. Each of these applications is discussed in further detail below.

Chemical Structure of Precursors

As discussed, at least some of the precursors employed in forming boron nitride, boron carbide, or boron carbonitride films can include boron-containing precursors having one or more B—H bonds. In some embodiments, the boron-containing precursors have no B—N bonds or B—C bonds. In other words, the boron-containing precursors do not have nitrogen or carbon built into the precursors in forming a carbide or nitride film. In some embodiments, the boron-containing precursor has one or more B—B bonds.

The boron-containing precursor can be a borane precursor generally having a chemical formula $B_xH_y$. In some embodiments, the borane precursor is borane ($BH_3$). In some embodiments, the borane precursor is diborane ($B_2H_6$). In some embodiments, the borane precursor is a higher order borane such as triborane ($B_3H_7$), tetraborane ($B_4H_{10}$), pentaborane ($B_5H_9$), hexaborane ($B_6H_{10}$), and decaborane ($B_{10}H_{14}$).

Boranes may form stable complexes such as borane amine complexes. For example, a borane amine complex may include dimethylamineborane complex (($CH_3)_2NH:BH_3$). The borane amine complex may generally have the chemical formula $NR_3:BH_3$, where R can be any combination of H or alkyl, allyl, alkenyl, alkynyl, alkylaryl, arylalkyl, phenyl, alkene, and alkyne ligands.

In some implementations, the boron-containing precursor can be a borazine generally having a chemical formula $B_xH_yN_z$. For example, a borazine precursor can have the chemical formula $B_3H_6N_3$.

Where the deposited boron-containing film is a boron carbide or boron carbonitride film, at least some of the precursors employed in the deposition reaction can include a carbon-containing precursor. The carbon-containing precursor can be any suitable hydrocarbon molecule. In some embodiments, the hydrocarbon molecule includes a carbon chain between 3 carbon atoms and 7 carbon atoms. In some embodiments, the hydrocarbon molecule may include one or more unsaturated carbon bonds, such as one or more carbon-to-carbon double bonds or triple bonds. Thus, the hydrocarbon molecule may include an alkene or alkyne group. Examples of suitable hydrocarbon molecules include propylene, ethylene, butene, pentene, butadiene, pentadiene (e.g., 1,4 pentadiene), hexadiene, hexadiene, heptadiene, toluene, and benzene. Additional examples of suitable hydrocarbon molecules include acetylene, propyne, butyne, pentyne (e.g., 1-pentyne), and hexyne (e.g., 2-hexyne).

In some embodiments, the carbon-containing precursor may be a depositing additive. A depositing additive may form species with the boron-containing precursor regardless of temperature, even for temperatures greater than about 50° C. or greater than about 25° C. The carbon-containing precursor does not serve as a passive spectator, but can significantly contribute to the composition of the boron-containing film. The carbon-containing precursor and byproducts of any reaction with the hydrogen radicals in the substantially low energy state or ground state may get incorporated in the boron-containing film in a substantial amount. As used herein, a "substantial amount" with respect to incorporation of the carbon from the carbon-containing precursor in the boron-containing film may refer to a change in atomic concentration of carbon by an amount equal to or greater than about 5% compared to deposition of the boron-containing film without the carbon-containing precursor.

Apparatus

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source provides mild reaction conditions in comparison to a direct plasma. An example of a suitable remote plasma apparatus is described in U.S. patent application Ser. No. 14/062,648, filed Oct. 24, 2013, which is incorporated herein by reference in its entirety and for all purposes.

Figure 3:
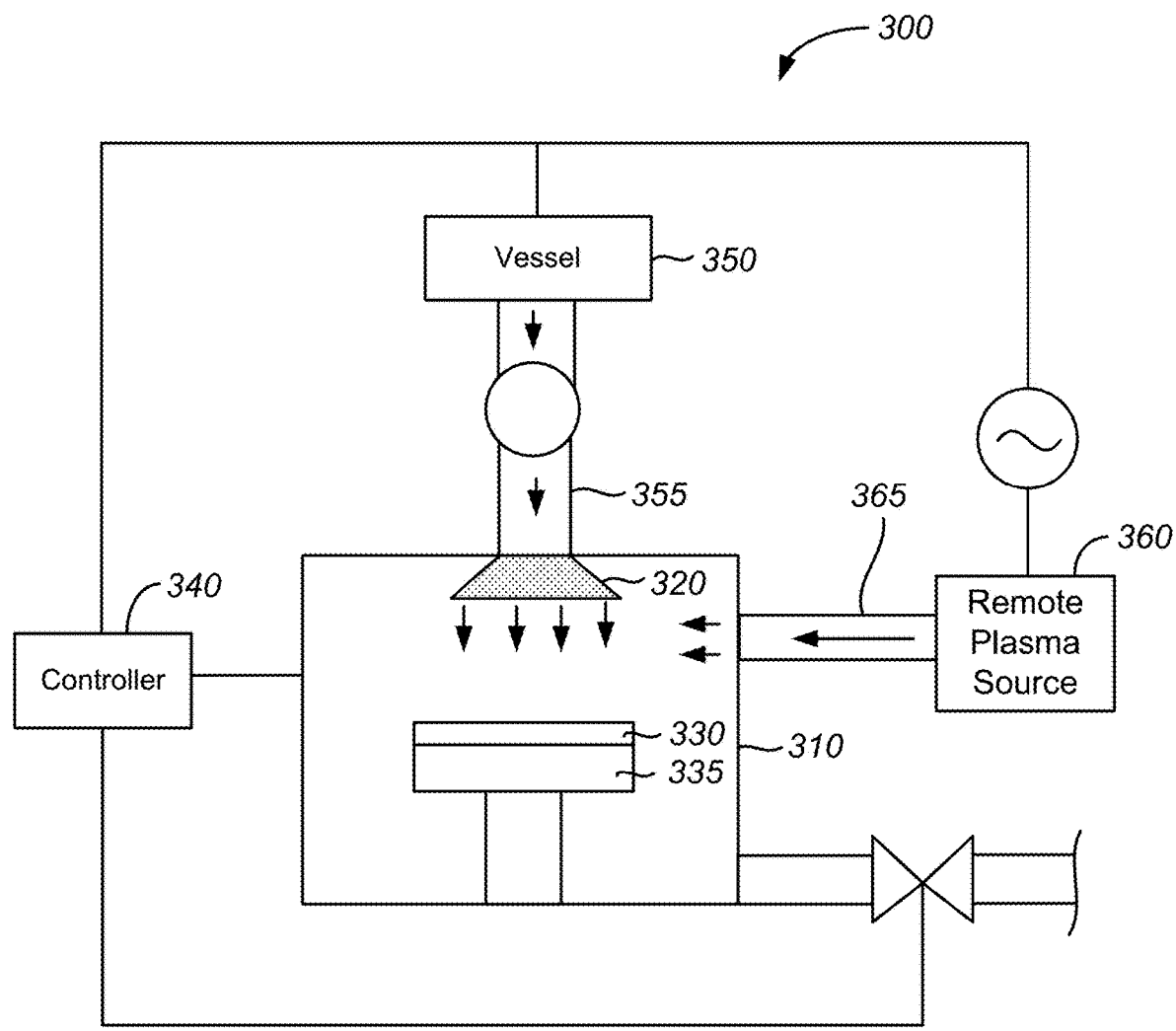
FIG. 3 illustrates a schematic diagram of an example plasma processing apparatus with a remote plasma source according to some implementations.

FIG. 3 presents a schematic diagram of a remote plasma apparatus according to certain embodiments. The device 300 includes a reaction chamber 310 with a showerhead 320. Inside the reaction chamber 310, a substrate 330 rests on a stage or pedestal 335. In some embodiments, the pedestal 335 can be fitted with a heating/cooling element. A controller 340 may be connected to the components of the device 300 to control the operation of the device 300. For example, the controller 340 may contain instructions for controlling process conditions for the operations of the device 300, such as the temperature process conditions and/or the pressure process conditions. In some embodiments, the controller 340 may contain instructions for controlling the flow rates of precursor gas, co-reactant gas, source gas, and carrier gas. The controller 340 may contain instructions for changing the flow rate of the co-reactant gas over time. In addition or in the alternative, the controller 340 may contain instructions for changing the flow rate of the precursor gas over time. A more detailed description of the controller 340 is provided below.

During operation, gases or gas mixtures are introduced into the reaction chamber 310 via one or more gas inlets coupled to the reaction chamber 310. In some embodiments, two or more gas inlets are coupled to the reaction chamber 310. A first gas inlet 355 can be coupled to the reaction chamber 310 and connected to a vessel 350, and a second gas inlet 365 can be coupled to the reaction chamber 310 and connected to a remote plasma source 360. In embodiments including remote plasma configurations, the delivery lines for the precursors and the radical species generated in the remote plasma source are separated. Hence, the precursors and the radical species do not substantially interact before reaching the substrate 330. It will be understood that in some implementations the gas lines may be reversed so that the vessel 350 may provide precursor gas flow through the second gas inlet 365 and the remote plasma source 360 may provide ions and radicals through the first gas inlet 355.

One or more radical species may be generated in the remote plasma source 360 and configured to enter the reaction chamber 310 via the gas second inlet 365. Any type of plasma source may be used in remote plasma source 360 to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 360 can be the GAMMA®, manufactured by Lam Research Corporation of Fremont, Calif. Another example of such a RF remote plasma source 360 can be the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 360, such as the Astex®, also manufactured by MKS Instruments. A microwave plasma can be configured to operate at a frequency of 2.45 GHz. Gas provided to the remote plasma source may include hydrogen, nitrogen, oxygen, and other gases as mentioned elsewhere herein. In certain embodiments, hydrogen is provided in a carrier such helium. As an example, hydrogen gas may be provided in a helium carrier at a concentration of about 1-10% hydrogen.

The precursors can be provided in vessel 350 and can be supplied to the showerhead 320 via the first gas inlet 355. The showerhead 320 distributes the precursors into the reaction chamber 310 toward the substrate 330. The substrate 330 can be located beneath the showerhead 320. It will be appreciated that the showerhead 320 can have any suitable shape, and may have any number and arrangement of ports for distributing gases to the substrate 330. The precursors can be supplied to the showerhead 320 and ultimately to the substrate 330 at a controlled flow rate.

The one or more radical species formed in the remote plasma source 360 can be carried in the gas phase toward the substrate 330. The one or more radical species can flow through a second gas inlet 365 into the reaction chamber 310. It will be understood that the second gas inlet 365 need not be transverse to the surface of the substrate 330 as illustrated in FIG. 3. In certain embodiments, the second gas inlet 365 can be directly above the substrate 330 or in other locations. The distance between the remote plasma source 360 and the reaction chamber 310 can be configured to provide mild reactive conditions such that the ionized species generated in the remote plasma source 360 are substantially neutralized, but at least some radical species in substantially low energy states remain in the environment adjacent to the substrate 330. Such low energy state radical species are not recombined to form stable compounds. The distance between the remote plasma source 360 and the reaction chamber 310 can be a function of the aggressiveness of the plasma (e.g., determined in part by the source RF power level), the density of gas in the plasma (e.g., if there's a high concentration of hydrogen atoms, a significant fraction of them may recombine to form $H_2$ before reaching the reaction chamber 310), and other factors. In some embodiments, the distance between the remote plasma source 360 and the reaction chamber 310 can be between about 1 cm and 30 cm, such as about 5 cm or about 15 cm.

In some embodiments, a carbon-containing precursor, which is not the primary boron-containing precursor or a hydrogen radical, is introduced during the deposition reaction. In some implementations, the apparatus is configured to introduce the nitrogen-containing plasma species through the second gas inlet 365, in which case the nitrogen-containing reactant is at least partially converted to plasma. In some implementations, the apparatus is configured to introduce the carbon-containing precursor through the showerhead 320 via the first gas inlet 355.

Figure 4:
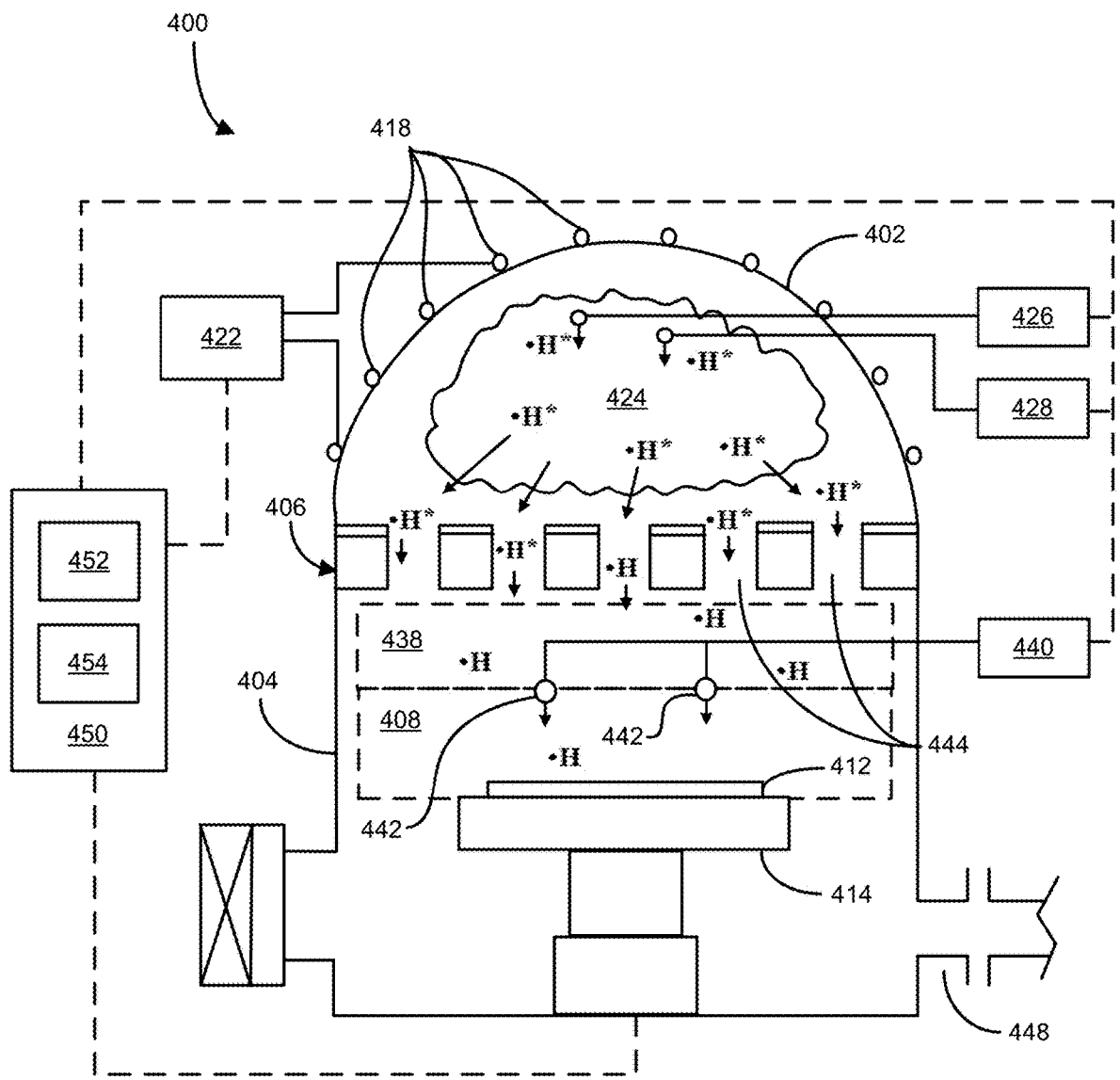
FIG. 4 illustrates a schematic diagram of an example plasma processing apparatus with a remote plasma source according to some other implementations.

FIG. 4 illustrates a schematic diagram of an example plasma processing apparatus with a remote plasma source according to some other implementations. The plasma processing apparatus 400 includes the remote plasma source 402 separated from a reaction chamber 404. The remote plasma source 402 is fluidly coupled with the reaction chamber 404 via a multiport gas distributor 406, which may also be referred to as a showerhead. Radical species are generated in the remote plasma source 402 and supplied to the reaction chamber 404. One or more boron-containing precursors are supplied to the reaction chamber 404 downstream from the remote plasma source 402 and from the multiport gas distributor 406. The one or more boron-containing precursors react with the radical species in a chemical vapor deposition zone 408 of the reaction chamber 404 to deposit a boron-containing film on a surface of a substrate 412. The chemical vapor deposition zone 408 includes an environment adjacent to the surface of the substrate 412.

The substrate 412 is supported on a substrate support or pedestal 414. The pedestal 414 may move within the reaction chamber 404 to position the substrate 412 within the chemical vapor deposition zone 408. In the embodiment shown in FIG. 4, pedestal 414 is shown having elevated the substrate 410 within the chemical vapor deposition zone 408. The pedestal 414 may also adjust the temperature of the substrate 412 in some embodiments, which can provide some selective control over thermally activated surface reactions on the substrate 412.

FIG. 4 shows a coil 418 arranged around the remote plasma source 402, where the remote plasma source 402 includes an outer wall (e.g., quartz dome). The coil 418 is electrically coupled to a plasma generator controller 422, which may be used to form and sustain plasma within a plasma region 424 via inductively coupled plasma generation. In some implementations, the plasma generator controller 422 may include a power supply for supplying power to the coil 418, where the power can be in a range between about 1 and 6 kilowatts (kW) during plasma generation. In some implementations, electrodes or antenna for parallel plate or capacitively coupled plasma generation may be used to generate a continuous supply of radicals via plasma excitation rather than inductively coupled plasma generation. Regardless of the mechanism used to ignite and sustain the plasma in the plasma region 424, radical species may continuously be generated using plasma excitation during film deposition. In some implementations, hydrogen radicals are generated under approximately steady-state conditions during steady-state film deposition, though transients may occur at the beginning and end of film deposition.

A supply of hydrogen radicals may be continuously generated within the plasma region 424 while hydrogen gas or other source gas is being supplied to the remote plasma source 402. Excited hydrogen radicals may be generated in the remote plasma source 402. If not re-excited or re-supplied with energy, or re-combined with other radicals, the excited hydrogen radicals lose their energy, or relax. Thus, excited hydrogen radicals may relax to form hydrogen radicals in a substantially low energy state or ground state.

The hydrogen gas or other source gas may be diluted with one or more additional gases. These one or more additional gases may be supplied to the remote plasma source 402. In some implementations, the hydrogen gas or other source gas is mixed with one or more additional gases to form a gas mixture, where the one or more additional gases can include a carrier gas. Non-limiting examples of additional gases can include helium (He), neon (Ne), argon (Ar), krypton (Kr), xenon (Xe), and nitrogen ($N_2$). The one or more additional gases may support or stabilize steady-state plasma conditions within the remote plasma source 402 or aid in transient plasma ignition or extinction processes. In some implementations, diluting hydrogen gas or other source gas with helium, for example, may permit higher total pressures without concomitant plasma breakdown. Put another way, a dilute gas mixture of hydrogen gas and helium may permit higher total gas pressure without increasing plasma power to the remote plasma source 402. As shown in FIG. 4, a source gas supply 426 is fluidly coupled with the remote plasma source 402 for supplying the hydrogen gas or source gas. In addition, an additional gas supply 428 is fluidly coupled with the remote plasma source 402 for supplying the one or more additional gases. The one or more additional gases may also include a co-reactant gas as described above. While the embodiment in FIG. 4 depicts the gas mixture of the source gas and the one or more additional gases being introduced through separate gas outlets, it will be understood that the gas mixture may be introduced directly into the remote plasma source 402. That is, a pre-mixed dilute gas mixture may be supplied to the remote plasma source 402 through a single gas outlet.

Gases, such as excited hydrogen and helium radicals and relaxed gases/radicals, flow out of the remote plasma source 402 and into the reaction chamber 404 via multiport gas distributor 406. Gases within the multiport gas distributor 406 and within the reaction chamber 404 are generally not subject to continued plasma excitation therein. In some implementations, the multiport gas distributor 406 includes an ion filter and/or a photon filter. Filtering ions and/or photons may reduce substrate damage, undesirable re-excitation of molecules, and/or selective breakdown or decomposition of boron-containing precursors within the reaction chamber 404. Multiport gas distributor 406 may have a plurality of gas ports 434 to diffuse the flow of gases into the reaction chamber 404. In some implementations, the plurality of gas ports 434 may be mutually spaced apart. In some implementations, the plurality of gas ports 434 may be arranged as an array of regularly spaced apart channels or through-holes extending through a plate separating the remote plasma source 402 and the reaction chamber 404. The plurality of gas ports 434 may smoothly disperse and diffuse exiting radicals from the remote plasma source 402 into the reaction chamber 404.

Typical remote plasma sources are far removed from reaction vessels. Consequently, radical extinction and recombination, e.g., via wall collision events, may reduce active species substantially. In contrast, in some implementations, dimensions for the plurality of gas ports 434 may be configured in view of the mean free path or gas flow residence time under typical processing conditions to aid the free passage of radicals into the reaction chamber 404. In some implementations, openings for the plurality of gas ports 434 may occupy between about 5% and about 20% of an exposed surface area of the multiport gas distributor 406. In some implementations, the plurality of gas ports 434 may each have an axial length to diameter ratio of between about 3:1 and 10:1 or between about 6:1 and about 8:1. Such aspect ratios may reduce wall-collision frequency for radical species passing through the plurality of gas ports 434 while providing sufficient time for a majority of excited state radical species to relax to ground state radical species. In some implementations, dimensions of the plurality of gas ports 434 may be configured so that the residence time of gases passing through the multiport gas distributor 406 is greater than the typical energetic relaxation time of an excited state radical species. Excited state radical species for hydrogen source gas may be denoted by .H* in FIG. 4 and ground state radical species for hydrogen source gas may be denoted by .H in FIG. 4.

In some implementations, excited state radical species exiting the plurality of gas ports 434 may flow into a relaxation zone 438 contained within an interior of the reaction chamber 404. The relaxation zone 438 is positioned upstream of the chemical vapor deposition zone 408 but downstream of the multiport gas distributor 406. Substantially all or at least 90% of the excited state radical species exiting the multiport gas distributor 406 will transition into relaxed state radical species in the relaxation zone 438. Put another way, almost all of the excited state radical species (e.g., excited hydrogen radicals) entering the relaxation zone 438 become de-excited or transition into a relaxed state radical species (e.g., ground state hydrogen radicals) before exiting the relaxation zone 438. In some implementations, process conditions or a geometry of the relaxation zone 438 may be configured so that the residence time of radical species flowing through the relaxation zone 438, e.g., a time determined by mean free path and mean molecular velocity, results in relaxed state radical species flowing out of the relaxation zone 438.

With the delivery of radical species to the relaxation zone 438 from the multiport gas distributor 406, one or more boron-containing precursors and/or one or more carbon-containing precursors may be introduced into the chemical vapor deposition zone 408. The one or more boron-containing precursors may be introduced via a gas distributor or gas outlet 442, where the gas outlet 442 may be fluidly coupled with a precursor supply source 440. The relaxation zone 438 may be contained within a space between the multiport gas distributor 406 and the gas outlet 442. The gas outlet 442 may include mutually spaced apart openings so that the flow of the one or more boron-containing precursors may be introduced in a direction parallel with gas mixture flowing from the relaxation zone 438. The gas outlet 442 may be located downstream from the multiport gas distributor 406 and the relaxation zone 438. The gas outlet 442 may be located upstream from the chemical vapor deposition zone 408 and the substrate 412. The chemical vapor deposition zone 408 is located within the interior of the reaction chamber 404 and between the gas outlet 442 and the substrate 412.

Substantially all of the flow of the one or more boron-containing precursors may be prevented from mixing with excited state radical species adjacent to the multiport gas distributor 406. Relaxed or ground state radical species mix in a region adjacent to the substrate 412 with the one or more boron-containing precursors. The chemical vapor deposition zone 408 includes the region adjacent to the substrate 412 where the relaxed or ground state radical species mix with the one or more boron-containing precursors. The relaxed or ground state radical species mix with the one or more boron-containing precursors in the gas phase during CVD formation of a boron-containing film.

In some implementations, a carbon-containing precursor may be introduced from the gas outlet 442 and flowed along with the one or more boron-containing precursors. The carbon-containing precursor may be introduced downstream from the remote plasma source 402. The carbon-containing precursor may be supplied from the precursor supply source 440 or other source (not shown) fluidly coupled to the gas outlet 442. The carbon-containing precursor may be a hydrocarbon molecule with one or more carbon-to-carbon double bonds or triple bonds. In some implementations, a nitrogen-containing plasma species may be introduced from the multiport gas distributor 406 and flowed along with the hydrogen radical species generated in the remote plasma source 402 and into the reaction chamber 404. This may include radicals and/or ions of a nitrogen-containing reactant provided in the remote plasma source 402. The nitrogen-containing reactant or any other co-reactant may be supplied from the additional gas supply 428.

The gas outlet 442 may be separated from the multiport gas distributor 406 by a sufficient distance to prevent back diffusion or back streaming of the one or more boron-containing precursors. In some implementations, the gas outlet 442 may be separated from the plurality of gas ports 434 by a distance between about 0.5 inches and about 5 inches, or between about 1.5 inches and about 4.5 inches, or between about 1.5 inches and about 3 inches.

Process gases may be removed from the reaction chamber 404 via an outlet 448 configured that is fluidly coupled to a pump (not shown). Thus, excess boron-containing precursors, carbon-containing precursors, radical species, and diluent and displacement or purge gases may be removed from the reaction chamber 404. In some implementations, a system controller 450 is in operative communication with the plasma processing apparatus 400. In some implementations, the system controller 450 includes a processor system 452 (e.g., microprocessor) configured to execute instructions held in a data system 454 (e.g., memory). In some implementations, the system controller 450 may be in communication with the plasma generator controller 422 to control plasma parameters and/or conditions. In some implementations, the system controller 450 may be in communication with the pedestal 414 to control pedestal elevation and temperature. In some implementations, the system controller 450 may control other processing conditions, such as RF power settings, frequency settings, duty cycles, pulse times, pressure within the reaction chamber 404, pressure within the remote plasma source 402, gas flow rates from the source gas supply 426 and the additional gas supply 428, gas flow rates from the precursor supply source 440 and other sources, temperature of the pedestal 414, and temperature of the reaction chamber 404, among others.

Aspects of the controller 450 of FIG. 4 described below also apply to the controller 340 of FIG. 3. The controller 450 may contain instructions for controlling process conditions for the operation of the plasma processing apparatus 400. The controller 450 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 450 or they may be provided over a network.

In certain embodiments, the controller 450 controls all or most activities of the plasma processing apparatus 400 described herein. For example, the controller 450 may control all or most activities of the plasma processing apparatus 400 associated with depositing a boron-containing film and, optionally, other operations in a fabrication flow that includes the boron-containing film. The controller 450 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 450 may be employed in some embodiments. To provide relatively mild reactive conditions at the environment adjacent to the substrate 412, parameters such as the RF power levels, gas flow rates to the plasma region 424, gas flow rates to the chemical vapor deposition zone 408, and timing of the plasma ignition can be adjusted and maintained by controller 450. Additionally, adjusting the substrate position may further reduce the presence of high-energy radical species at the environment adjacent to the substrate 412. In a multi-station reactor, the controller 450 may comprise different or identical instructions for different apparatus stations, thus allowing the apparatus stations to operate either independently or synchronously.

In some embodiments, the controller 450 may include instructions for performing operations such as flowing one or more boron-containing precursors through the gas outlet 442 into the reaction chamber 404, providing a source gas into the remote plasma source 402, generating one or more radical species of the source gas in the remote plasma source 402, introducing the one or more radical species in a substantially low energy state from the remote plasma source 402 into the reaction chamber 404 to react with the one or more boron-containing precursors to deposit a boron-containing film on the substrate 412. The one or more radical species in the reaction chamber 404 in an environment adjacent to the substrate 412 may be hydrogen radicals in a ground state. In some implementations, the controller 450 may include instructions for flowing a carbon-containing precursor with the one or more boron-containing precursors into the reaction chamber 404. In some implementations, the source gas can include a nitrogen-containing reactant such as nitrogen gas or ammonia.

In some embodiments, the apparatus 400 may include a user interface associated with controller 450. The user interface may include a display screen, graphical software displays of the apparatus 400 and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., boron nitride, boron carbide, or boron carbonitride), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to the boron-containing film deposition described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Structure, Composition, and Properties of the Deposited Film

Many boron-containing films, including boron nitride, boron carbide, and boron carbonitride films, are deposited using PECVD or thermal CVD processes. However, the properties of such films may not have a desirable dielectric constant, step coverage, etch selectivity, chemical stability, and thermal stability, among other properties. For example, PECVD processes in depositing a boron nitride or boron carbonitride film may result in films with high NH content. High NH content may adversely impact the mechanical properties of the film, such as the film's hardness and Young's modulus and susceptibility to etching. Also, PECVD processes in depositing a boron carbide or boron carbonitride film may result in films with a significant amount of C—C bonds, C—N bonds, or N—N bonds. A significant amount of C—C bonds, C—N bonds, or N—N bonds may lead to inconsistent properties within the film because the film may not have regular chemical structure. For example, an area of the film with more B—C and B—N bonds may perform differently than an area of the film with more C—C, C—N, or N—N bonds. More B—C and B—N bonds may provide a higher Young's modulus and different chemical reactivity (e.g., etch rate). The present disclosure relates to deposition of boron-containing films using remote plasma CVD. The boron-containing film may have no or substantially no C—C bonds. Further, in some embodiments, the boron-containing film may have no or substantially no C—N bonds, and no or substantially no N—N bonds.

Figure 5:
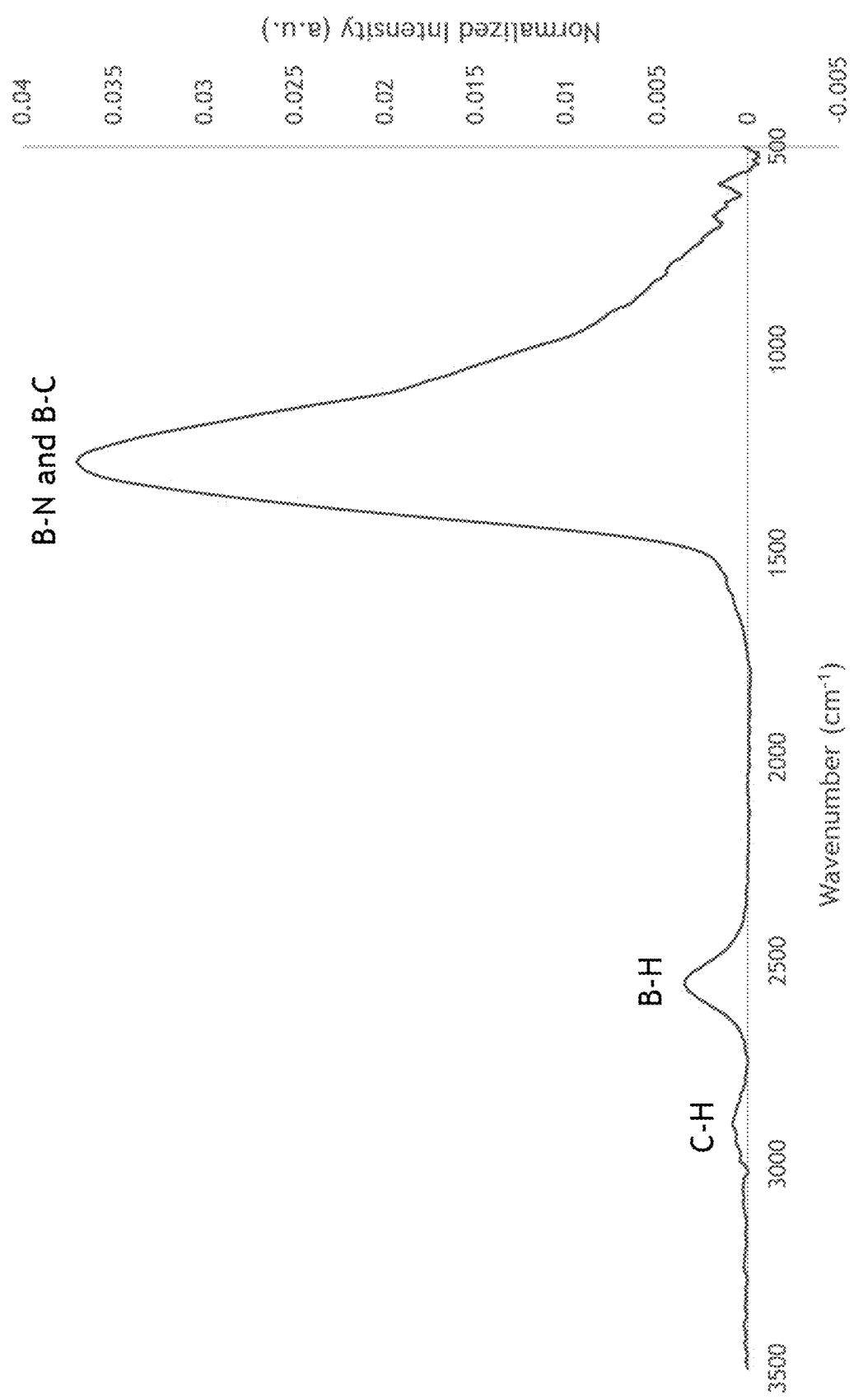
FIG. 5 shows a graph of a FTIR spectrum for remote plasma CVD of a boron carbonitride film using a boron-containing precursor, carbon-containing precursor, and remote hydrogen plasma.
Figure 6:
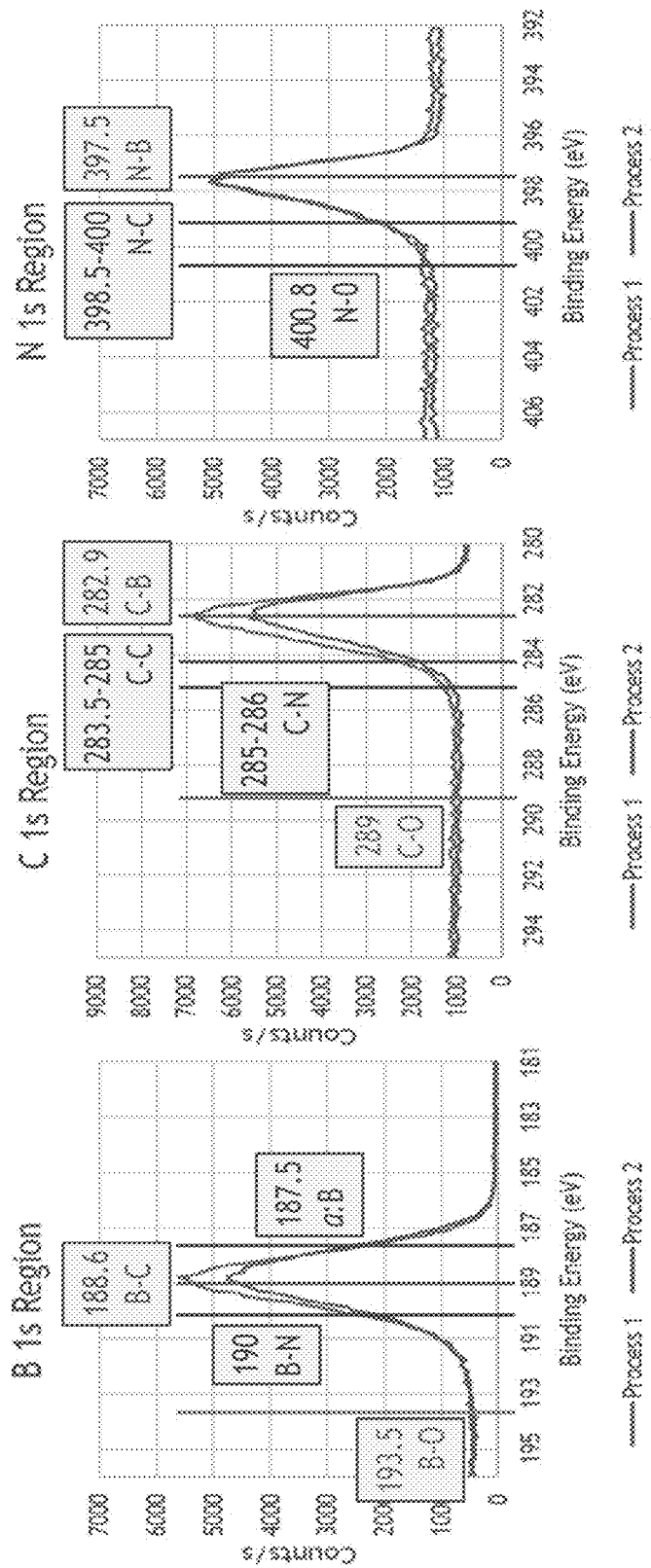
FIG. 6 shows graphs of XPS data for B 1 s, C 1 s, and N 1 s for a boron carbonitride thin film deposited on a substrate.

FIG. 5 shows a graph of a FTIR spectrum for remote plasma CVD of a boron carbonitride film using a boron-containing precursor, carbon-containing precursor, and remote hydrogen plasma. The boron-containing precursor included a borane precursor and the carbon-containing precursor included a hydrocarbon molecule with one or more carbon-to-carbon double bonds or triple bonds. The remote hydrogen plasma included a source gas of a nitrogen-containing reactant and hydrogen gas ($H_2$) to produce radicals of hydrogen and nitrogen. As shown in the FTIR spectrum in FIG. 5, B—H bonds, B—N bonds, and B—C bonds were present in the boron carbonitride film. However, C—C, C—N, and N—N bonds were not present in the boron carbonitride film. This is confirmed by the x-ray photoelectron spectroscopy (XPS) data in FIG. 6. FIG. 6 shows graphs of XPS data for B 1 s, C 1 s, and N 1 s for the boron carbonitride thin film. The XPS data for B is shows peaks at a binding energy indicative of B—C bonds. The XPS data for C 1 s shows peaks at a binding energy indicative of B—C bonds but not C—C bonds, C—N bonds, or C—O bonds. The XPS data for N 1 s shows peaks indicative of B—N bonds but not N—C bonds or N—O bonds.

Table 1 shows various properties of the boron carbonitride film produced by remote plasma CVD processes resulting in different boron carbonitride film compositions. Each boron carbonitride film has an atomic concentration of boron that is greater than 50%. Each boron carbonitride film has a film density greater than 1.60 g/cm³, with the hydrogen-rich remote plasma CVD process producing a denser film that is greater than 1.70 g/cm³. Each boron carbonitride film has a Young's modulus greater than 130 GPa, with the hydrogen-rich remote plasma CVD process producing a film with a Young's modulus greater than 150 GPa. Each boron carbonitride film has a relatively low intrinsic stress value, not having too much compressive stress and not having too much tensile stress. Specifically, the boron carbonitride film has an intrinsic stress value between −120 MPa and 120 MPa.

TABLE 1

| Composition (Atomic %) | Film Density (g/cm³) | Refractive Index | Modulus (GPa) | Stress (MPa) |
| --- | --- | --- | --- | --- |
| $B_1C_{0.37}N_{0.13}H_{0.27}$ | 1.67 | 2.055 | 132 | 56 |
| $B_1C_{0.32}N_{0.15}H_{0.25}$ | 1.77 | 2.115 | 153 | −113 |

The process conditions of the present disclosure may provide for a boron-containing film with desirable mechanical properties. The boron-containing film may have a sufficiently high Young's modulus value without an excessively high compressive or tensile intrinsic stress value. In some implementations, the boron-containing film may have a composition with one or more B—C and/or B—N bonds. The boron-containing film may have no or substantially no C—C bonds, C—N bonds, and N—N bonds. C—C, C—N, or N—N bonds may have an adverse impact on the Young's modulus of the boron-containing film. In some implementations, a percentage of C—C bonds, C—N bonds, or N—N bonds in the boron-containing film is equal to or less than about 2%, equal to or less than about 1%, equal to or less than about 0.5%, or even 0%. In some implementations, the boron-containing film has a Young's modulus value equal to or greater than about 130 GPa, or equal to or greater than about 150 GPa. In some implementations, the boron-containing film has an intrinsic stress value between about −120 MPa and about 120 MPa, or between about −75 MPa and about 75 MPa.

Figure 7:
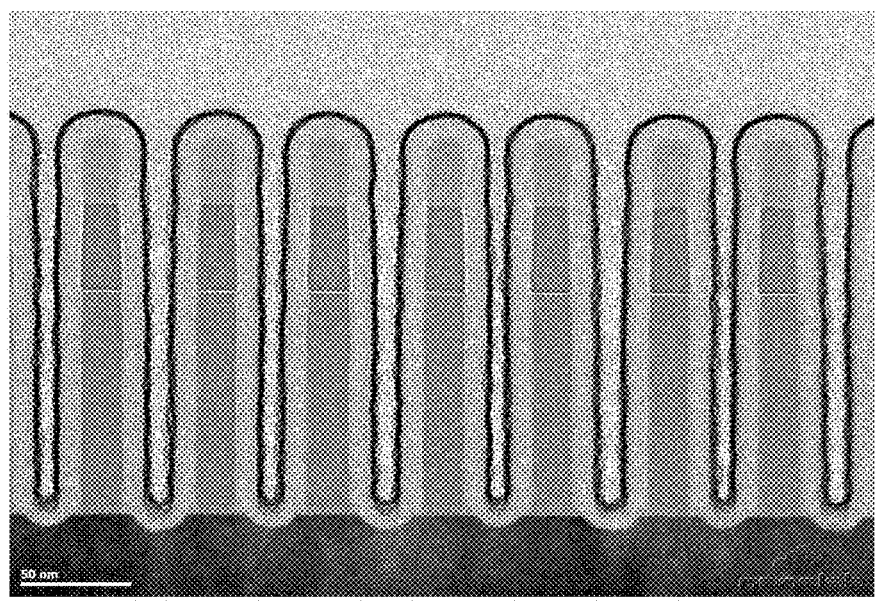
FIG. 7 shows a TEM image a boron carbonitride thin film deposited on substrate features using a boron-containing precursor, carbon-containing precursor, and remote hydrogen plasma with a carrier gas.

FIG. 7 shows a TEM image a boron carbonitride thin film deposited on substrate features using a boron-containing precursor, carbon-containing precursor, and remote hydrogen plasma with a carrier gas. The boron-containing precursor was a borane precursor and the carbon-containing precursor was a hydrocarbon molecule with one or more carbon-to-carbon double bonds or triple bonds, which were provided downstream from the remote plasma. The remote hydrogen plasma included hydrogen radicals and nitrogen radicals. A carrier gas was flowed with the source gas. In some implementations, no carrier gas is flowed with the source gas. The boron carbonitride film deposited on the substrate features had a step coverage of at least 95%, where the substrate features had a height to depth aspect ratio of 7:1.

Boron nitride, boron carbide, and boron carbonitride films can have unique etch properties and/or selectivities. The boron nitride, boron carbide, and boron carbonitride films may be able to etch under certain etch chemistries and resistant to etch under other etch chemistries. In some implementations, the boron nitride, boron carbide, and boron carbonitride film may have different etch properties depending on whether the film has been oxidized.

The deposited film will include boron, and in some cases nitrogen, carbon, and/or one or more other elements. In some embodiments, the atomic concentration of boron is between about 30% and about 75% or between about 35% and about 70%. In some embodiments, the atomic concentration of carbon is between about 10% and about 50% or between about 15% and about 45%. In some embodiments, the atomic concentration of nitrogen is between about 3% and about 25% or between about 5% and about 20%. In all cases, the film may contain some hydrogen. However, it will be understood that the relative atomic concentration of hydrogen will be small. In some embodiments, the atomic concentration of hydrogen is less than about 25%, between about 2% and about 20%, or between about 5% and about 15%. In one example, a boron carbonitride film contains about 50-60% boron, about 15-25% carbon, about 5-10% nitrogen, and about 5-15% hydrogen. It will be understood that the relative atomic concentrations can vary depending on the choice of the precursors.

The boron atoms will form bonds with carbon and/or nitrogen atoms. The carbon atoms will not form bonds with other carbon atoms or nitrogen atoms, and the nitrogen atoms will not form bonds with other nitrogen atoms or carbon atoms. In some embodiments, the deposited film contains more B—C bonds than B—N bonds. This can provide for a film with a low dielectric constant. This can also provide for a film with a high Young's modulus. In some examples, the deposited film contains a ratio of B—C bonds to B—N bonds that is between about 1:1 and 3:1. In certain embodiments, the film density is between about 1.5 and 2.5 g/cm$^3$.

The process conditions described earlier herein can provide a film structure that is highly conformal. The relatively mild process conditions can minimize the degree of ion bombardment at the surface of the substrate so that the deposition lacks directionality. Moreover, the relatively mild process conditions can reduce the number of radicals with high sticking coefficients that would have a tendency to stick to the sidewalls of previously deposited layers or films. Conformality may be calculated by comparing the average thickness of a deposited film on a bottom, sidewall, or top of a feature to the average thickness of a deposited film on a bottom, sidewall, or top of a feature. For example, conformality may be calculated by dividing the average thickness of the deposited film on the sidewall by the average thickness of the deposited film at the top of the feature and multiplying it by 100 to obtain a percentage. "Features" as used herein may refer to a non-planar structure on the substrate, typically a surface being modified in a semiconductor device fabrication operation. Examples of features include trenches, vias, pads, pillars, domes, and the like. A feature typically has an aspect ratio (depth or height to width). In certain embodiments, for features having an aspect ratio of about 2:1 or more, the boron-containing film may be deposited with a conformality between about 50% and 100%, more typically between about 80% and 100%, and even more typically between about 90% and 100%. For example, a boron carbonitride film on a feature between about 5:1 and about 10:1 may have a conformality of at least 95%.

The process conditions can also provide a film structure with a low dielectric constant. The boron-containing film may be formed of a majority of B—C bonds and/or B—N bonds with a limited or no amount of C—C bonds, C—N bonds, or N—N bonds. This can provide for improved electrical and mechanical properties while maintaining a relatively low dielectric constant. In various embodiments, the boron-containing film has an effective dielectric constant of about 5.0 or lower, of about 4.0 or lower, of about 3.5 or lower, or of about 3.0 or lower. In some embodiments, the boron-containing film has an effective dielectric constant between about 2.0 and about 5.0.

Applications

The present disclosure may be further understood by reference to the following applications for high-quality boron-containing films, which applications are intended to be purely illustrative. The present disclosure is not limited in scope by the specified applications, which are simply illustrations of aspects of the present disclosure.

In some embodiments, a boron-containing film may be deposited over exposed copper. In some embodiments in depositing the boron-containing film, reaction conditions adjacent to the substrate can be free of oxidants, such as $O_2$, $O_3$, and $CO_2$, including radicals thereof. Thus, the boron-containing film may be deposited directly over the exposed copper without oxidizing copper (e.g., creating cupric oxide). Such boron-containing films can serve as etch stop layers, which can also serve as copper diffusion barriers. The presence of the boron-containing film can provide a sufficiently low dielectric constant with excellent leakage properties to serve as a diffusion barrier. In some embodiments, the boron-containing film can be placed in between adjacent metallization layers that are typically produced by a damascene process. The boron-containing film can resist etching and can be sufficiently dense to minimize the diffusion of copper ions into adjacent regions of dielectric material. The boron-containing films may serve as capping materials to encapsulate copper and may have excellent adhesion to copper or copper alloy surface.

In some embodiments as shown in FIG. 1B, a boron-containing film 111 can be conformally deposited on features 112 of a substrate 110. The features 112 can be isolated or dense features, where the features 112 can have relatively small critical dimensions (CD). In some embodiments, the features can have a CD that is equal to or less than about 20 nm, equal to or less than about 10 nm, or equal to or less than about 5 nm. The height to width aspect ratio of the features 112 can be greater than 2:1, greater than 5:1, greater than 10:1, or greater than 20:1. The step coverage of the boron-containing film 111 deposited on the features 112 is at least 80%, at least 85%, at least 90%, or at least 95%.

In some embodiments, boron-containing film may be deposited as vertical structures adjacent to metal or semiconductor structures. Deposition of boron nitride, boron carbide, or boron carbonitride provides excellent step coverage along sidewalls of metal or semiconductor structures to create the vertical structures. In certain embodiments, the vertical structures may be referred to as spacers or liners. Boron nitride, boron carbide, and boron carbonitride vertical structures may serve as an ashable conformal hard mask with a high modulus and low dielectric constant. Thus, a boron-containing film may function as a low dielectric constant spacer or liner in a variety of applications.

FIG. 1C illustrates a cross-section of boron-containing liners 121 deposited on the sidewalls of a gate electrode structure of a transistor. As illustrated in FIG. 1C, the transistor can be a CMOS transistor with a silicon substrate 120 having a source 122 and a drain 123. A gate dielectric 124 can be deposited over the silicon substrate 120, and a gate electrode 125 can be deposited over the gate dielectric 124 to form the transistor. Oxygen doped silicon carbide spacers or liners 121 can be deposited on the sidewalls of the gate electrode 125 and gate dielectric 124.

In another example, FIG. 1D illustrates a cross-section of boron-containing films deposited on sidewalls of exposed copper lines in an air gap type metallization layer. Air gaps 130 can be introduced into an integrated circuit layer between copper lines 132 that can reduce the effective k-value of the layer. Boron-containing liners 131 can be deposited on the sidewalls of the copper lines 132, and a nonconformal dielectric layer 133 can be deposited on the air gaps 130, liners 131, and copper lines 132. Examples of such air gap type metallization layers can be described in U.S. Patent Application Publication No. 2004/0232552 to Fei Wang et al., which is herein incorporated by reference in its entirety and for all purposes.

In some embodiments, an oxygen doped silicon carbide film may be deposited on the sidewalls of patterned porous dielectric materials. Ultra low-k dielectric materials can be made from a porous structure. The pores in such materials can provide areas for ingress of metal during deposition of subsequent layers, including the deposition of diffusion barriers containing a metal such as tantalum (Ta). If too much metal migrates into the dielectric material, the dielectric material may provide a short circuit between adjacent copper metallization lines. Accordingly, not only can boron-containing films serve as barrier layers, etch stops, encapsulating layers, ashable conformal hard masks, spacers, liners, but boron-containing films can serve as pore sealants.

FIG. 1E illustrates a cross-section of boron-containing film as a pore sealant for porous dielectric materials. A porous dielectric layer 142 can have a plurality of trenches or vias cut into the porous dielectric layer 142 to form pores 140. Boron-containing film 141 can be deposited along the pores 140 to effectively seal the pores 140. Sealing the pores 140 with the boron-containing film 141 can avoid damaging the porous dielectric layer 142 that may otherwise be incurred by other sealing techniques using a plasma. The boron-containing film 141 can be sufficiently dense as a pore sealant. In some embodiments, an etched dielectric material such as the porous dielectric layer 142 may first be treated by a "k-recovery" process, which exposes the porous dielectric layer 142 to UV radiation and a reducing agent. This recovery process is further described in commonly owned U.S. Patent Application Publication No. 2011/0111533 to Varadarajan et al., which is incorporated by reference herein in its entirety and for all purposes. In another "k-recovery" process, the porous dielectric layer 142 can be exposed to UV radiation and a chemical silylating agent. This recovery process is further described in commonly owned U.S. Patent Application Publication No. 2011/0117678 to Varadarajan et al., which is incorporated by reference herein in its entirety and for all purposes. After exposing the pores 140 to the recovery treatment, which makes the surface more hydrophilic and provides a monolayer of material, a layer of conformally deposited boron-containing film 141 can be deposited to effectively seal the pores 140 of the porous dielectric layer 142.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing a boron-carbon-containing film on a substrate, the method comprising:
providing a substrate in a reaction chamber;
flowing a boron-containing precursor into the reaction chamber towards the substrate, wherein the boron-containing precursor has one or more B—H bonds;
co-flowing a carbon-containing precursor with the boron-containing precursor into the reaction chamber;
generating, from a hydrogen source gas of molecular hydrogen ($H_2$), radicals of hydrogen in a remote plasma source that are generated upstream of the boron-containing precursor and the carbon-containing precursor; and
introducing the radicals of hydrogen into the reaction chamber and towards the substrate prior to deposition, wherein the radicals of hydrogen are in a ground state to react with the boron-containing precursor and the carbon-containing precursor to form a boron-carbon-containing film on the substrate.

2. The method of claim 1, wherein all or substantially all of the radicals of hydrogen in an environment adjacent to the substrate are radicals of hydrogen in the ground state.

3. The method of claim 1, wherein the boron-containing precursor includes a borane.

4. The method of claim 3, wherein the boron-containing precursor includes diborane, triborane, tetraborane, pentaborane, hexaborane, or decaborane.

5. The method of claim 3, wherein the boron-containing precursor includes a borane amine complex.

6. The method of claim 1, wherein the carbon-containing precursor is a hydrocarbon molecule with at least a carbon-to-carbon double bond or triple bond.

7. The method of claim 6, wherein the carbon-containing precursor includes propylene, ethylene, butene, pentene, butadiene, pentadiene, hexadiene, heptadiene, toluene, benzene, acetylene, propyne, butyne, pentyne, or hexyne.

8. The method of claim 1, wherein the boron-containing film has no C—C bonds or substantially no C—C bonds.

9. The method of claim 1, further comprising:
providing a nitrogen-containing reactant along with the hydrogen source gas in the remote plasma source, wherein radicals of the nitrogen-containing reactant are generated in the remote plasma source; and
introducing the radicals of the nitrogen-containing reactant along with the radicals of hydrogen into the reaction chamber and towards the substrate, wherein the radicals of the nitrogen-containing reactant and hydrogen react with the boron-containing precursor and the carbon-containing precursor to form a boron carbonitride (BCN) film.

10. The method of claim 9, wherein the BCN film has no C—C bonds or substantially no C—C bonds, no C—N bonds or substantially no C—N bonds, and no N—N or substantially no N—N bonds.

11. The method of claim 9, wherein the nitrogen-containing reactant includes nitrogen ($N_2$) or ammonia ($NH_3$).

12. The method of claim 1, wherein the boron-carbon-containing film has a conformality of at least 95%.

13. The method of claim 1, wherein the boron-carbon-containing film has a Young's modulus equal to or greater than about 130 GPa.

14. The method of claim 1, wherein the boron-carbon-containing film has an effective dielectric constant equal to or less than about 4.0.

15. The method of claim 1, wherein boron-carbon-containing film has an intrinsic stress value between about −120 MPa and about 120 MPa.

16. The method of claim 1, wherein the boron-containing precursor has one or more B—C and/or B—N bonds.

17. The method of claim 1, wherein an atomic concentration of boron in the boron-carbon-containing film is between about 30% and about 75% and an atomic concentration of carbon in the boron-carbon-containing film is between about 15% and about 45%.

18. A method of depositing a boron-containing film on a substrate, the method comprising: providing a substrate in a reaction chamber; flowing a boron-containing precursor into the reaction chamber towards the substrate, wherein the boron-containing precursor has one or more B—H bonds; generating, from a source gas including molecular hydrogen ($H_2$) and a nitrogen-containing reactant, radicals of hydrogen and the nitrogen-containing reactant in a remote plasma source that are generated upstream of the boron-containing precursor; and introducing the radicals of hydrogen and the nitrogen-containing reactant into the reaction chamber and towards the substrate, the radicals of hydrogen and the nitrogen-containing reactant being in an environment adjacent to the substrate prior to deposition, wherein the radicals of hydrogen are in a ground state to react with the boron-containing precursor to form a boron-containing film on the substrate.

19. The method of claim 18, further comprising:
co-flowing a carbon-containing precursor with the boron-containing precursor into the reaction chamber, wherein the radicals of hydrogen in the ground state react with the boron-containing precursor and the carbon-containing precursor to form the boron-containing film.

* * * * *